US011161125B2

(12) United States Patent
Sharifzadeh Mirshekarloo et al.

(10) Patent No.: US 11,161,125 B2
(45) Date of Patent: Nov. 2, 2021

(54) FLUID JET DISPENSER USING MULTILAYER CERAMIC ACTUATORS

(71) Applicant: AGENCY FOR SCIENCE, TECHNOLOGY AND RESEARCH, Singapore (SG)

(72) Inventors: Meysam Sharifzadeh Mirshekarloo, Singapore (SG); Kui Yao, Singapore (SG); Szu Cheng Lai, Singapore (SG); Chee Kiang Ivan Tan, Singapore (SG); Lei Zhang, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 632 days.

(21) Appl. No.: 15/739,695

(22) PCT Filed: Jun. 22, 2016

(86) PCT No.: PCT/SG2016/050284
§ 371 (c)(1),
(2) Date: Dec. 22, 2017

(87) PCT Pub. No.: WO2016/209168
PCT Pub. Date: Dec. 29, 2016

(65) Prior Publication Data
US 2018/0193849 A1    Jul. 12, 2018

(30) Foreign Application Priority Data

Jun. 22, 2015 (SG) .............................. 10201504949P

(51) Int. Cl.
*H01L 41/083* (2006.01)
*B05B 1/08* (2006.01)
(Continued)

(52) U.S. Cl.
CPC ............ *B05B 1/083* (2013.01); *H01L 41/083* (2013.01); *H01L 41/1875* (2013.01); *H02N 2/043* (2013.01); *H02N 2/067* (2013.01)

(58) Field of Classification Search
CPC combination set(s) only.
See application file for complete search history.

(56) References Cited

U.S. PATENT DOCUMENTS 3,501,099 A    3/1970  Benson
5,165,809 A   11/1992  Takahashi et al.
(Continued)

OTHER PUBLICATIONS

PCT International Search Report for PCT Counterpart Application No. PCT/SG2016/050284, 8 pgs. (dated Sep. 8, 2016).
(Continued)

*Primary Examiner* — Bryan P Gordon
(74) *Attorney, Agent, or Firm* — Womble Bond Dickinson (US) LLP

(57) ABSTRACT

A fluid jet dispenser using at least two multilayer piezoelectric actuators is provided. The fluid jet dispenser includes a dispensing head and an electrical driver. The dispensing head includes at least two $d_{31}$-mode multilayer piezoelectric actuators, a displacement magnifying element mechanically coupled to the d31-mode multilayer piezoelectric actuators, a piston, and a nozzle. More preferably, the two d31-mode multilayer piezoelectric actuators operate in an anti-phase condition. The electrical driver is electrically coupled to the d31-mode multilayer piezoelectric actuators for displacing the actuators in directions substantially perpendicular to polarization of piezoelectric layers in the d31-mode multilayer piezoelectric actuators in response to charging and discharging of the actuators by the electrical driver, to generate a fast movement of the piston to jet a pressurized fluid out of the nozzle of the dispensing head.

16 Claims, 15 Drawing Sheets

(51) Int. Cl.
*H01L 41/187* (2006.01)
*H02N 2/04* (2006.01)
*H02N 2/06* (2006.01)

(56) References Cited

U.S. PATENT DOCUMENTS

| | | | |
|---|---|---|---|
| 5,622,748 | A | 4/1997 | Takeuchi et al. |
| 6,274,966 | B1 | 8/2001 | Kohno et al. |
| 6,464,202 | B1 | 10/2002 | Boecking |
| 8,470,211 | B2 | 6/2013 | Yao et al. |
| 2003/0122902 | A1 | 7/2003 | Sakaida et al. |
| 2005/0219793 | A1* | 10/2005 | Matsuda ............ H01L 41/0973 361/321.2 |
| 2007/0040472 | A1* | 2/2007 | Smith ................... H02N 2/067 310/317 |
| 2007/0241304 | A1 | 10/2007 | Yao et al. |
| 2009/0102325 | A1* | 4/2009 | Ozawa ................ C01G 23/003 310/358 |
| 2009/0179526 | A1* | 7/2009 | Bindig ................. H01L 41/083 310/365 |
| 2014/0062346 | A1 | 3/2014 | Feng et al. |
| 2014/0184878 | A1 | 7/2014 | Watanabe et al. |
| 2016/0193624 | A1* | 7/2016 | Ikushima ............ B05B 17/0653 239/102.2 |

OTHER PUBLICATIONS

PCT Written Opinion for PCT Counterpart Application No. PCT/SG2016/050284, 6 pgs. (dated Sep. 8, 2016).
K. Yao, et al., "Design and Fabrication of a High Performance Multilayer Piezoelectric Actuator with Bending Deformation," IEEE Transactions on Ultrasonics, Ferroelectronics, and Frequency Control, vol. 46, No. 4. pp. 1020-1027 (Jul. 31, 1999).
PCT Notification of the "International Preliminary Report on Patentability" for Counterpart PCT Application No. PCT/SG2016/050284; dated Dec. 26, 2017; 7 pp.

* cited by examiner

FLUID JET DISPENSER USING MULTILAYER CERAMIC ACTUATORS

CROSS-REFERENCE TO RELATED APPLICATIONS

This patent application is a U.S. National Phase Application under 35 U.S.C. § 371 of international Application No. PCT/SG2016/050284, filed on 22 Jun. 2016, entitled FLUID JET DISPENSER USING MULTILAYER CERAMIC ACTUATORS, which claims priority from Singapore Patent Application No. 10201504949P filed 22 Jun. 2015.

TECHNICAL FIELD

The present invention generally relates to apparatuses for fluid jet dispensing, and more particularly relates to fluid jet dispensers using multilayer ceramic actuators.

BACKGROUND OF THE DISCLOSURE

Controlled generation of fine and monodisperse fluid droplets was initially developed to improve the resolution of ink jet printing and is now widely used in a variety of industrial and scientific applications, such as chemical deposition, DNA arraying, drug delivery, electronics manufacturing, production of functional particles and microcapsules, and fuel injection. In these applications, the generation of uniform, controllable and reproducible droplets is the common goal. To achieve this goal, a large variety of jet dispensing technologies with different operating principles has been developed. These include pneumatic, electromagnetic, thermal, electrostatic and piezoelectric actuation technologies. Among these various actuation technologies, piezoelectric actuation has the advantages of high precision, high speed, large force generation capacity, compactness and simplified scalable structures which have made piezoelectric materials very attractive for micro-droplet generation and dispensing.

The conventional piezoelectric fluid jet dispensers utilize multilayer actuator operating in $d_{33}$-mode. This means that the polarization direction of the piezoelectric is in the direction of utilized displacement of the actuator. Furthermore, the actuators of these fluid jet dispensers are fabricated through ceramic stacking. The ceramic stacking method consists of fabrication of a required number of individual piezoelectric ceramic disks, grinding of each of these individual disks to a required specified dimension, electroding of each disk, poling of the individual disks and stacking of the disks to get the desired actuator and performance. The process must necessarily be repeated for fabrication of every actuator. If during the fabrication process or during device operation any of the layers is shorted, the whole actuator will not function. Thus, this fabrication method is costly, tedious, time consuming, and not scalable for mass production.

Thus, what is needed are fluid jet dispensers utilizing specifically designed actuators, which at least partially overcome the drawbacks of present approaches by lowering the cost and including actuators produced with highly scalable fabrication methods. Furthermore, other desirable features and characteristics will become apparent from the subsequent detailed description and the appended claims, taken in conjunction with the accompanying drawings and this background of the disclosure.

SUMMARY

In accordance with one embodiment of the present invention, a fluid jet dispenser is provided. The fluid jet dispenser includes a dispensing head including at least two $d_{31}$-mode multilayer piezoelectric actuators. Each of the $d_{31}$-mode multilayer piezoelectric actuators includes multiple electrode layers and multiple piezoelectric layers. The multiple piezoelectric layers include $d_{31}$-mode piezoelectric layers with polarization substantially perpendicular to a utilized displacement direction of the piezoelectric actuator upon charging of the piezoelectric actuator. Each of the $d_{31}$-mode multilayer piezoelectric actuators also includes an electrical driver electrically coupled to the at least two $d_{31}$-mode multilayer piezoelectric actuators for charging and discharging the at least two $d_{31}$-mode multilayer piezoelectric actuators to drive them backward and forward in the utilized displacement direction.

In accordance with another embodiment of the present invention, a piezoelectric ceramic actuator is provided. The piezoelectric ceramic actuator includes multiple metal electrode layers and multiple piezoelectric ceramic layers. The multiple piezoelectric ceramic layers include $d_{31}$-mode piezoelectric layers and a polarization of the $d_{31}$-mode piezoelectric layers is substantially perpendicular to a direction of utilized displacement of the piezoelectric ceramic actuator upon charging of the piezoelectric ceramic actuator. The $d_{31}$-mode piezoelectric layers include a ceramic composition having a sintering temperature of 950° C. or below and the multiple metal electrode layers comprise metal selected from the group comprising silver (Ag), a silver palladium alloy (Ag/Pd alloy) having a low palladium concentration of ≤10 wt %, nickel, a nickel alloy, copper, or a copper alloy.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with a present embodiment.

FIG. 9, comprising FIGS. 9A and 9B, depicts enlarged images of the $d_{31}$-mode multilayer piezoelectric actuators fabricated by the fabrication process of FIG. 6 in accordance with the present embodiment, wherein FIG. 9A depicts a surface morphology of the $d_{31}$-mode multilayer piezoelectric actuators and FIG. 9B depicts a cross-section of the $d_{31}$-mode multilayer piezoelectric actuators.

FIG. 18, comprising FIGS. 18A and 18B, depicts graphs of charging and discharging profiles across the piezoelectric actuator in accordance with the present embodiment, wherein FIG. 18A depicts the charging profile across the piezoelectric actuator exhibiting a rise-time of twenty-five microseconds and FIG. 18B depicts the discharging profile across the piezoelectric actuator exhibiting a fall-time of fifteen microseconds.

Figure 1:
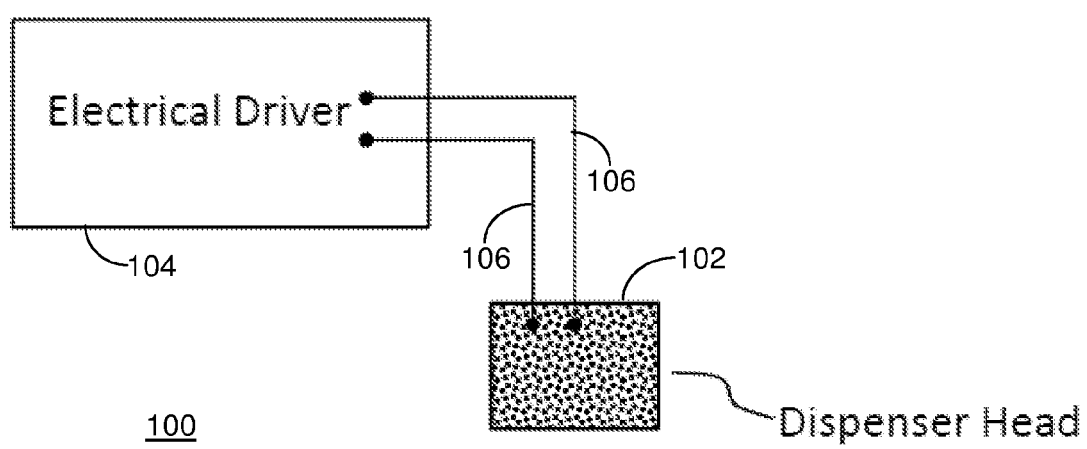
FIG. 1 depicts a block diagram of major components of a fluid jet dispenser in accordance with a present embodiment.

Skilled artisans will appreciate that elements in the figures are illustrated for simplicity and clarity and have not necessarily been depicted to scale.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description. It is the intent of the present embodiment to present a fluid jet dispenser using at least two multilayer piezoelectric actuators operating in piezoelectric $d_{31}$-mode. Preferably, the two multilayer piezoelectric actuators operate in anti-phase to each other. Each multilayer actuator includes multiple piezoelectric ceramic layers which are co-fired with multiple electrode layers at a low sintering temperature. The fluid jet dispenser has an electrical driver to deliver two anti-phase driving pulses with very small rise and fall times to the actuators to generate high speed anti-phase mechanical movement. The anti-phase movement of the actuators imposes a push-pull force on a displacement magnifying element causing a fast and periodic movement of a piston to jet a pressurized fluid out of a nozzle of the dispenser.

In contrast to conventional liquid jet dispensers, a fluid jet dispenser in accordance with the present embodiment utilizes $d_{31}$-mode co-fired multilayer actuators in which the direction of polarization is perpendicular to the utilized displacement direction. This advantageously allows a reduction of the number of layers required for fabrication of the multilayer actuators while maintaining similar dimensions and performance properties of conventional $d_{33}$-mode multilayer stack actuators. With a lesser number of layers, the risk of fabrication of faulty actuators is reduced thereby increasing actuator yield and reducing actuator cost.

In contrast to $d_{33}$-mode multilayer stack actuators, utilizing the $d_{31}$-mode co-fired multilayer actuators in accordance with the present embodiment advantageously allows use of a low-cost, scalable multilayer fabrication process including tape casting, screen printing, lamination, dicing, co-firing, end termination and poling steps. A larger number of actuators can be produced in a single cycle of the fabrication process as compared to conventional actuator fabrication processes. The lowered cost of the actuators reduces the cost of resulting fluid jet dispensers while maintaining competitive dispenser performance.

Conventional $Pb(Zr,Ti)O_3$ (PZT) piezoelectric ceramic requires sintering at a high temperature, typically 1200° C. or higher. The high sintering temperature requires the use of expensive metal electrode materials (e.g., Platinum (Pt) or Palladium (Pd)) to be co-fired with the PZT ceramic to form high quality piezoelectric multilayer actuators, thereby increasing the fabrication cost of conventional multilayer actuators. A piezoelectric ceramic material with a low sintering temperature (e.g., 950° C.) having composition of $0.1Pb(Ni_{1/3}Nb_{2/3})O_3$-$0.35Pb(Zn_{1/3}Nb_{2/3})O_3$-$0.15Pb(Mg_{1/3}Nb_{2/3})O_3$-$0.1PbZrO_3$-$0.3PbTiO_3$-4 mol % excess NiO is used in accordance with the present embodiment to realize co-fired multilayer actuators sintered at a temperature of 950° C. This allows the use of less expensive electrode materials (e.g., an Ag—Pd alloy with a low Pd concentration or Ag mixed with ceramic powder) to be co-fired with the ceramic layers of multilayer actuator. The reduced sintering temperature as well as the feasibility of using cheap electrode materials further reduces the cost of the actuators and, consequently, the cost of the fluid jet dispenser. The low processing temperature also minimizes the lead volatility and requires lower cost manufacturing facilities.

In addition, the good piezoelectric properties in conventionally used PZT piezoelectric ceramic can be obtained only in compositions close to their morphotropic phase boundary. The PZT piezoelectric ceramic performance properties will degrade substantially with compositional fluctuations. The piezoelectric ceramic powder composition used in accordance with the present embodiment, however, can offer the required piezoelectric properties even at compositions substantially away from their morphotropic phase boundary. Hence, the performance properties are not as sensitive to composition fluctuations. This will facilitate production of actuators with repeatable and consistent performance, thereby further improving the consistency and reliability of the performance of the fluid jet dispenser.

Co-fired $d_{31}$-mode multilayer piezoelectric actuators in accordance with the present embodiment could potentially achieve improved performance with thinner ceramic layers. However, thinner layers could lead to larger capacitance and increase the RC delay at the actuator end and limit the actuation speed, which may suppress the performance of fluid jet dispensers employing such co-fired $d_{31}$-mode multilayer piezoelectric actuators. To realize the advantages of the co-fired $d_{31}$-mode multilayer piezoelectric actuators for liquid dispensing, a specialized electrical driver in accordance with the present embodiment is dedicated to driving the co-fired $d_{31}$-mode multilayer piezoelectric actuators for liquid dispensing.

In a conventional electrical driver, the piezoelectric actuator is charged and discharged with a high voltage amplifier integrated circuit (IC) device. Such conventional electrical drivers have not been adequately configured for ultra-fast voltage switching across the capacitive load. This is due to the slow slew-rate of the amplifier's IC device, its limited output current and current sink—all of these factors lead to slow charging and discharging of the piezoelectric actuator. In contrast, the electrical driver in accordance with the present embodiment uses a pre-charged reserve capacitor to provide a huge transient current for rapidly charging the piezoelectric actuators. Such rapid charging is further enabled with a low impedance push-pull transistor switch connecting the piezoelectric actuators to the reserve capacitor. The push-pull transistor switch is also configured to enable low-ohmic discharge, thus achieving rapid charge dissipation on the piezoelectric actuator.

In conventional piezoelectric fluid jet dispensers with push-pull mechanisms for utilizing two piezoelectric actuators, only one of the actuators is active at any one time while the second actuator is biased with a DC voltage to induce a snap-back force when discharging the active actuator. The reduced charging and discharging time of the driver circuit utilized in accordance with the present embodiment will enable fast driving of both actuators with concurrent anti-phase displacement for realizing the push-pull operation. The concurrent anti-phase displacement will enhance piston displacement as well as piston block force of the fluid jet dispenser and improve overall operation performance.

Referring to FIG. 1, a block diagram 100 depicts major components of a fluid jet dispenser in accordance with a present embodiment. The fluid jet dispenser includes a dispenser head 102 including at least two co-fired $d_{31}$-mode multilayer piezoelectric actuators and a displacement magnifying element coupled to the said piezoelectric actuator. An electrical driver 104 is electrically coupled to the piezoelectric actuators of the dispenser head 102 by electrical connections 106.

Figure 2:
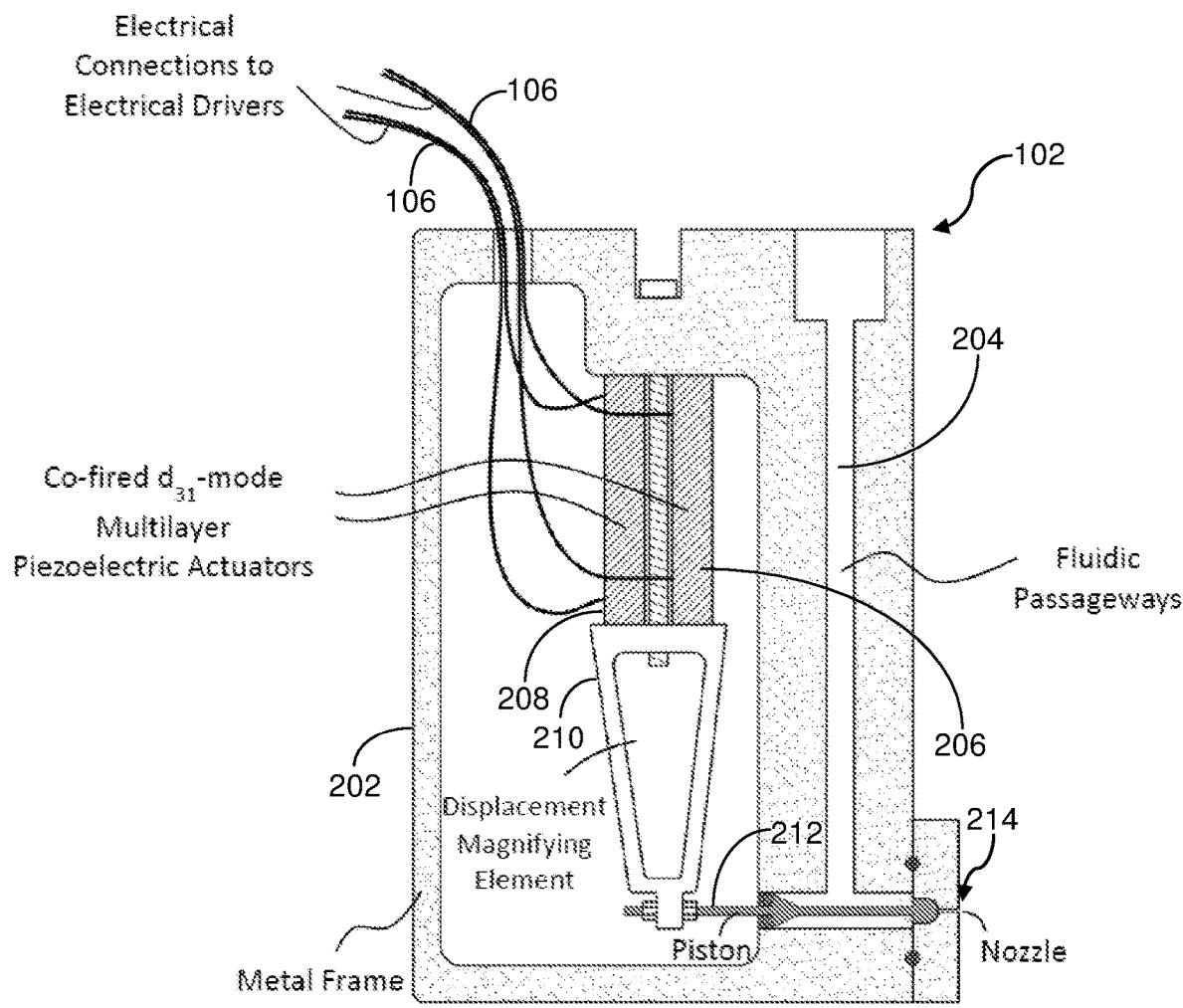
FIG. 2 depicts a side planar cutaway view of the piezoelectric fluid jet dispenser head in accordance with the present embodiment.

FIG. 2 depicts a side planar cutaway view 200 of the piezoelectric fluid jet dispenser head 102 in accordance with the present embodiment. The dispenser head 102 includes a metal frame 202, fluidic passageways 204, two piezoelectric actuators 206, 208, a displacement magnifying element 210, a piston 212, a nozzle 214 and the electrical connections 106. While the driving voltage is applied to at least one of the piezoelectric actuators 206, 208 with a polarization along a lateral direction (a thickness direction) at any one time, a vertical displacement along the length of the actuator 206, 208 is generated in the length direction through the $d_{31}$-mode piezoelectric response. The vertical displacement is magnified in the displacement magnifying element 210 and transformed to a lateral movement of the piston 212. A pressurized fluid is continuously fed into the nozzle 214 through the fluidic passageways 204. The backward and forward movement of the piston 212 periodically opens and closes the nozzle 214. In addition, the piston 212 applies a momentum to the fluid accumulated at the nozzle 214, thereby generating a droplet with adequate force and displacement from the piston 212.

Figure 3:
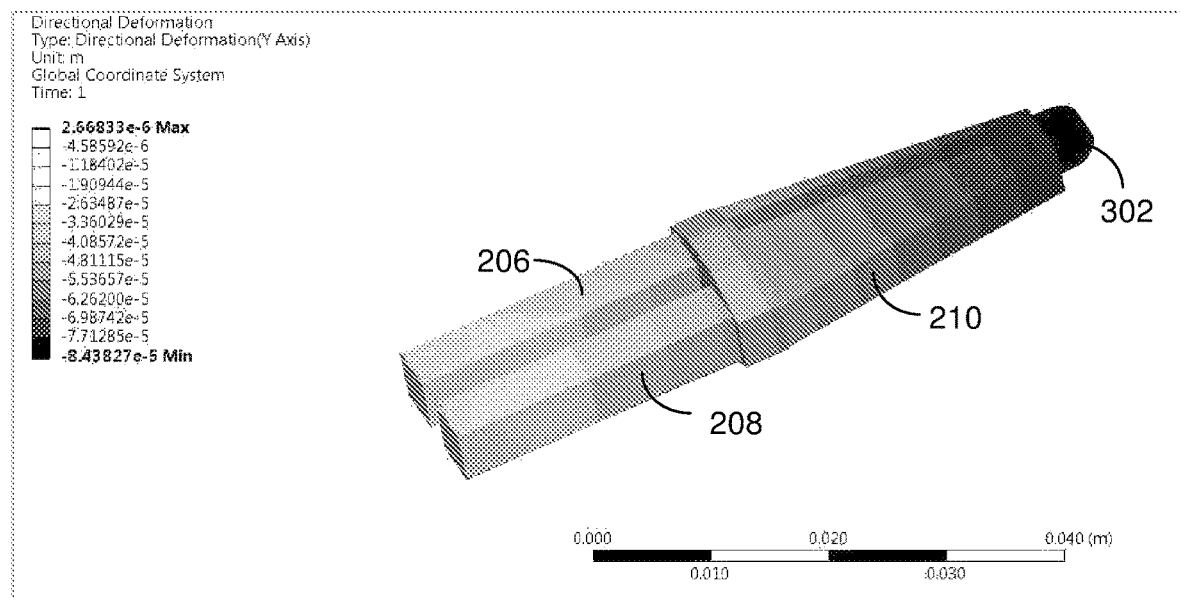
FIG. 3 depicts a rear top left perspective view of three-dimensional modeling of lateral displacement of the displacement magnifying element of FIG. 2 driven by one active actuator in accordance with the present embodiment.
Figure 4:
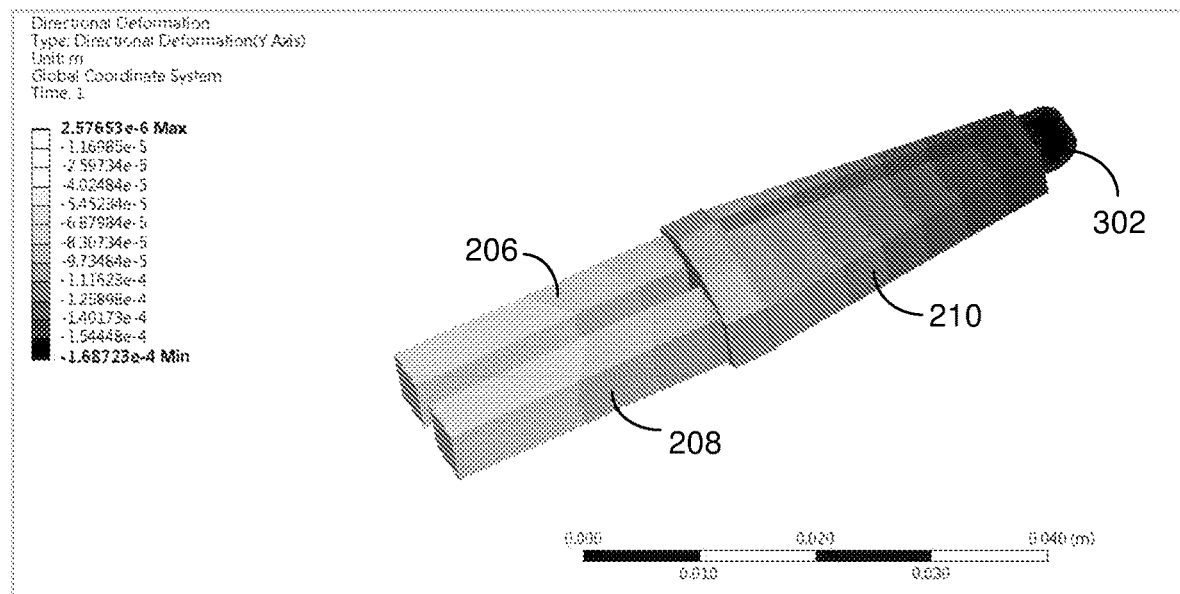
FIG. 4 depicts a rear top left perspective view of three-dimensional modeling of lateral displacement of the displacement magnifying element of FIG. 2 driven by two active actuators in accordance with the present embodiment.

Referring to FIG. 3 and FIG. 4, rear top left perspective views 300, 400 of three-dimensional modeling of lateral displacements of the displacement magnifying element 210 driven by one active actuator (in perspective view 300) and driven by two active actuators (in perspective view 400) in accordance with the present embodiment are depicted. The use of the two active actuators 206, 208 will double the displacement and blocked force at a tip 302 of the displacement magnifying element 210, and hence at the piston 212 (FIG. 2), as compared to that of using one active actuator. It can be seen from the numerical simulation conducted by using commercial software, as shown in the perspective views 300, 400, that the displacement of the tip 302 of the displacement magnifying element 210 increases from 84.4 micrometres (µm) of one active actuator 206 in the perspective view 300 to 168.7 µm in the perspective view 400 by using the two active actuators 206, 208 with an applied electric field of 2 kV/mm. The corresponding blocked force at the tip 302 of the displacement magnifying element 210 is also doubled from 44.3 Newton (N) to 88.6 N.

Figure 5:
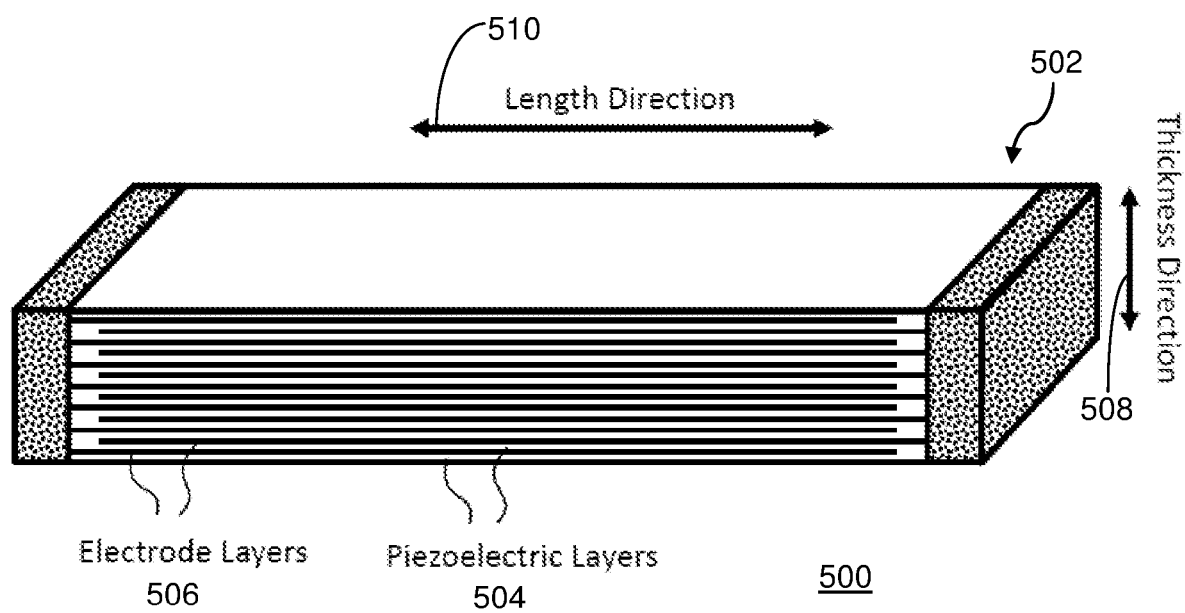
FIG. 5 illustrates a front top left perspective view of a $d_{31}$-mode multilayer piezoelectric actuator in accordance with the present embodiment.

FIG. 5 illustrates a front top left perspective view 500 of a $d_{31}$-mode multilayer piezoelectric actuator 502 in accordance with the present embodiment. In accordance with the present embodiment, the two piezoelectric actuators 206, 208 of the dispensing head 102 are a $d_{31}$-mode multilayer piezoelectric actuator 502. The $d_{31}$-mode multilayer piezoelectric actuator 502 includes a plurality of piezoelectric layers 504 and electrode layers 506. The electrode layers 506 are alternatively connected to each other. In accordance with the present embodiment, one thickness of each piezoelectric layer 504 is approximately 190 µm and the multilayer actuator 502 consists of 20 layers. The multilayer piezoelectric actuator 502 is constructed such that a direction of polarization and a direction of an applied voltage are in a thickness direction 508 of each piezoelectric layer 504, which is perpendicular to the actuation direction used (i.e., a length direction 510). During application of the driving voltage, the actuator 502 will contract or expand due to the transverse piezoelectric response determined by coefficient of $d_{31}$.

Figure 6:
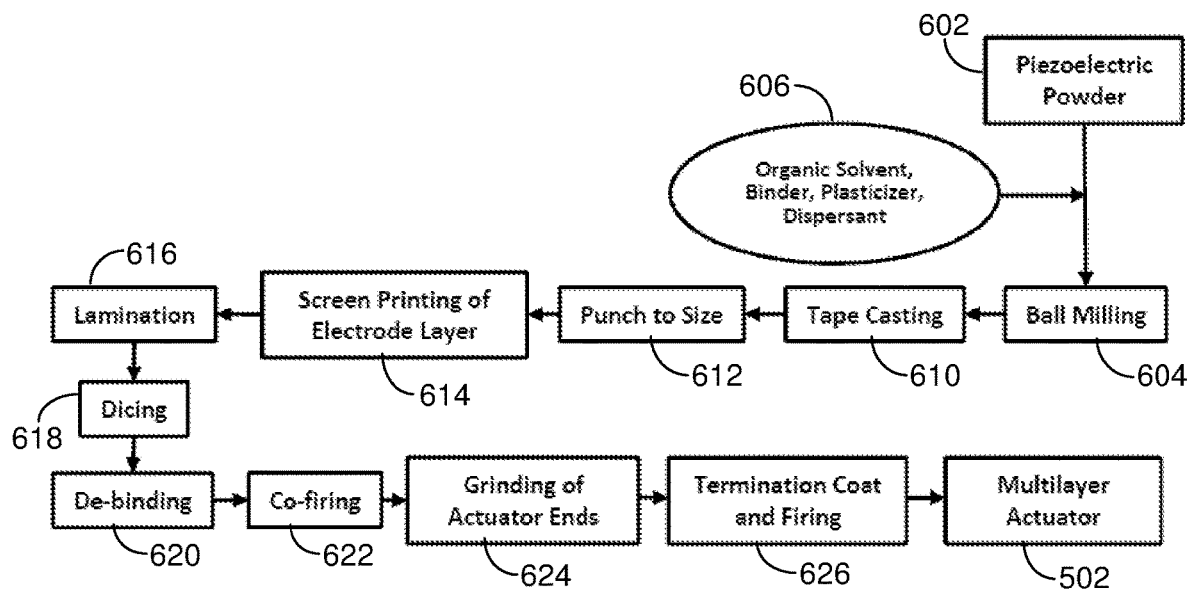
FIG. 6 depicts a block diagram of a fabrication process of the $d_{31}$-mode multilayer piezoelectric actuator of FIG. 5 in accordance with the present embodiment.

FIG. 6 depicts a block diagram 600 of a fabrication process of the $d_{31}$-mode multilayer piezoelectric actuator 502 in accordance with the present embodiment. The piezoelectric layers 504 are fabricated from a 0.1PNN-0.35PZN-0.15PMN-0.10PZ-0.3PT-0.04NiO piezoelectric ceramic powder 602. The 0.1PNN-0.35PZN-0.15PMN-0.10PZ-0.3PT-0.04NiO piezoelectric ceramic powders 602 were fabricated by a columbite approach. The piezoelectric properties of the piezoelectric ceramic powder 602 composition are not as sensitive to composition fluctuation as conventional piezoelectric ceramic powder because the piezoelectric ceramic powder 602 composition in accordance with the present embodiment lies substantially away from its morphotropic phase boundary. Hence fabrication of actuators with consistently excellent piezoelectric properties can be realized using the piezoelectric ceramic powder 602 during scaled-up production.

The 0.1PNN-0.35PZN-0.15PMN-0.10PZ-0.3PT-0.04NiO piezoelectric ceramic powder 602 (after calcined at 900° C.) is ball-milled to reduce particle size to less than one µm. The piezoelectric ceramic powder 602 is then ball milled 604 with a mixture 606 of an organic solvent, a binder, a plasticizer, and a dispersant to prepare the tape casting slurry. To compensate for lead loss, 1 wt % of PbO is also added to the mixture 606. Green tapes are tape-casted 610 by a doctor blade through a continuous roll to roll process with a desired thickness of 30-50 μm and dried at room temperature. The green tapes are then punched 612 into square tapes and the Ag/Pd electrode or other metal or alloy electrode layers 506 are screen printed 614 onto the ceramic tapes. In accordance with the present embodiment, less expensive Ag/Pd electrode layer (such as comprising a Ag/Pd alloy with a low Pd concentration (≤10 wt %)), or only Ag or other less expensive base metal or alloy such as Ni or Cu alloy is used. The electroded tapes are then stacked according to the configuration shown in the perspective view 500 and laminated 616 under pressure for one hour at a temperature of about 90° C. Un-electroded layers can be introduced between the electroded layers 506 to achieve increased thickness, if necessary.

The green laminates are then diced 618 into individual actuators and de-binded 620 at 500° C. for one hour before the metal-ceramic layers are co-fired 622 at 950° C. in air for another one hour. The typical sintering temperature for commercial PZT ceramic is around 1200° C. Thus, the low co-firing 622 temperature together with the scalable tape-casting fabrication process 610 can significantly reduce the unit cost of each piezoelectric actuator fabricated in accordance with the present embodiment. The reason is that the low sintering temperature as a character of the ceramic material allows the use of less expensive electrode materials (such as a Ag/Pd alloy with a low Pd concentration (≤10 wt %)), or only Ag or other less expensive base metal or alloy such as Ni or Cu alloys, to be co-fired with the ceramic layers to form the multilayer actuator.

Figure 7:
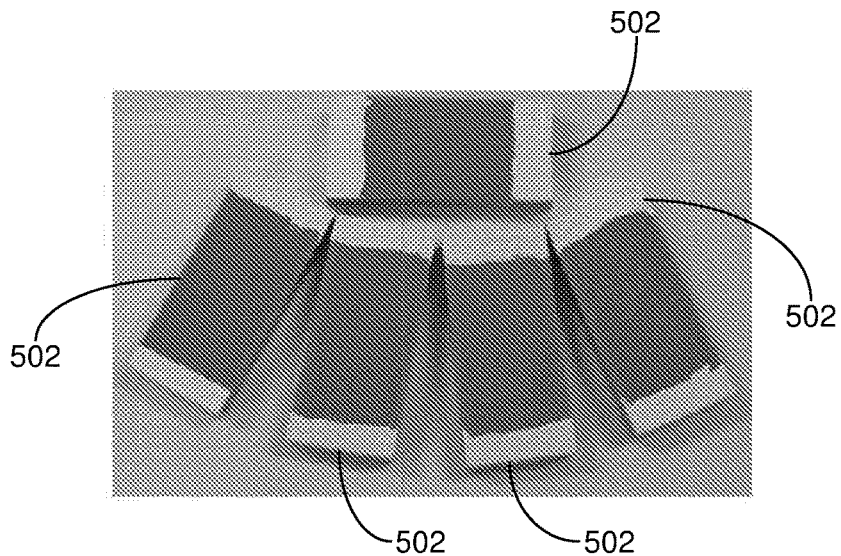
FIG. 7 depicts a photograph of exemplary $d_{31}$-mode multilayer piezoelectric actuators fabricated by the fabrication process of FIG. 6 in accordance with the present embodiment.

The co-fired $d_{31}$-mode multilayer piezoelectric actuators are then grinded 624 followed by end termination coat and firing 626 using silver paste to form the electrical connection between internal electrodes and create soldering pads for the electrical connections 106 to the electrical driver 104. In this manner, the co-fired $d_{31}$-mode multilayer piezoelectric actuators 502 are fabricated. Referring to FIG. 7, an illustration 700 depicts the $d_{31}$-mode multilayer piezoelectric actuators 502 fabricated by the fabrication process of FIG. 6 in accordance with the present embodiment.

Figure 8:
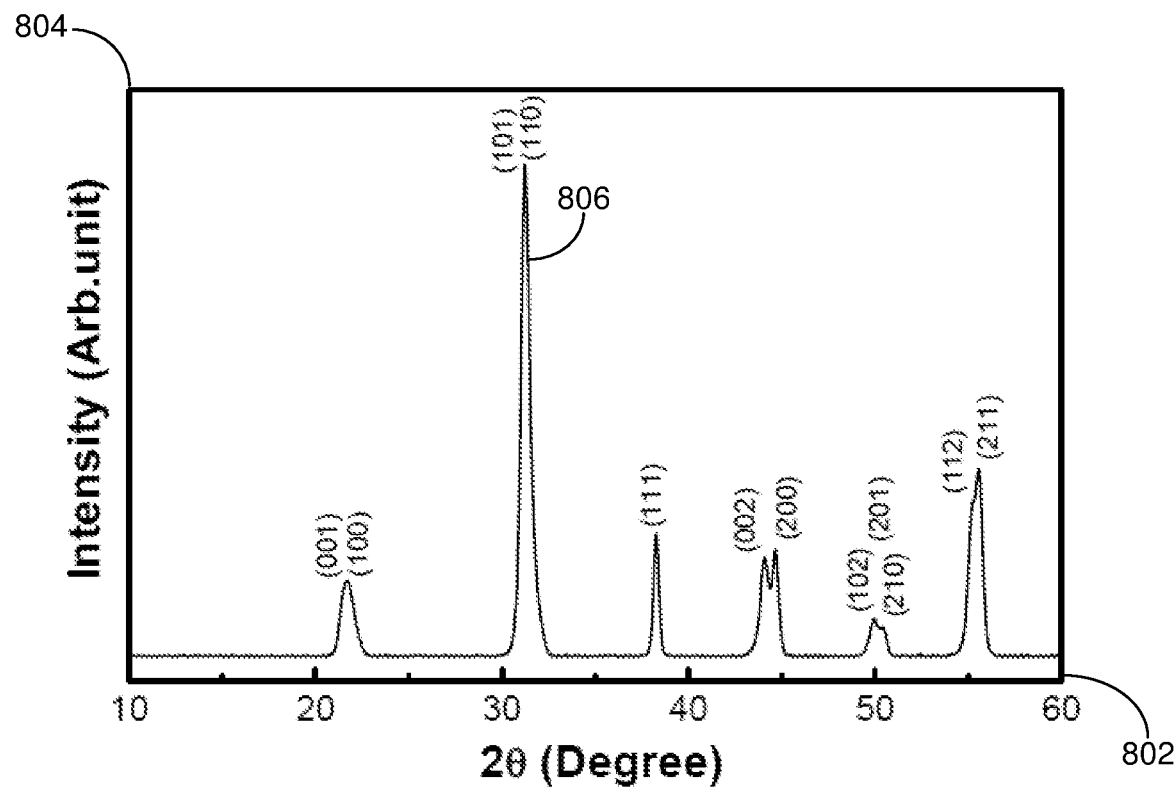
FIG. 8 depicts a graph of a XRD pattern of $d_{31}$-mode multilayer piezoelectric actuators fabricated by the fabrication process of FIG. 6 in accordance with the present embodiment.

FIG. 8 depicts a graph 800 of a XRD pattern of $d_{31}$-mode multilayer piezoelectric actuators fabricated by the fabrication process of FIG. 6 in accordance with the present embodiment. Diffraction angle 2Θ is plotted along an x-axis 802 and a relative intensity of XRD peaks is plotted along a y-axis 804. The XRD peaks are indexed in reference to $Pb(Zr_{0.52}Ti_{0.48})O_3$ (see JCPDS No. 33-0784). As shown in the graph 800, a single-phase perovskite structure is observed in all samples without any secondary phase peaks. It is also noted that the co-fired $d_{31}$-mode multilayer piezoelectric actuators exhibits a pure tetragonal phase 806 indicating the phase is substantially away from a morphotropic phase boundary between the tetragonal and the rhombohedral phases like $Pb(Zr_{0.52}Ti_{0.48})O_3$.

Figure 9A:
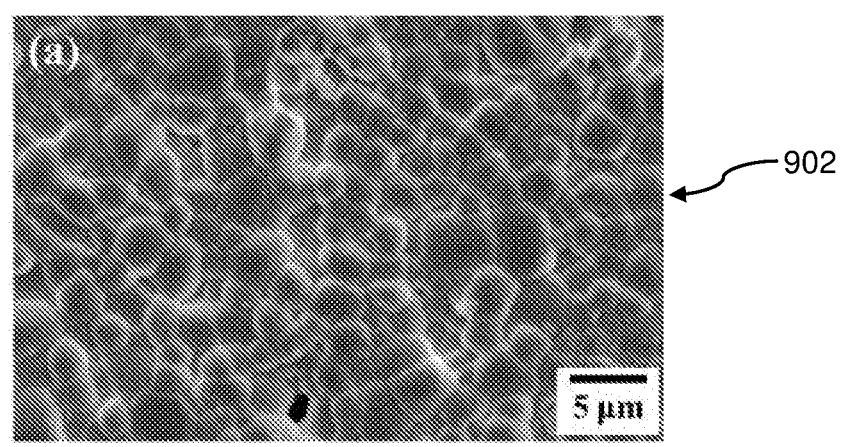
Figure 9B:
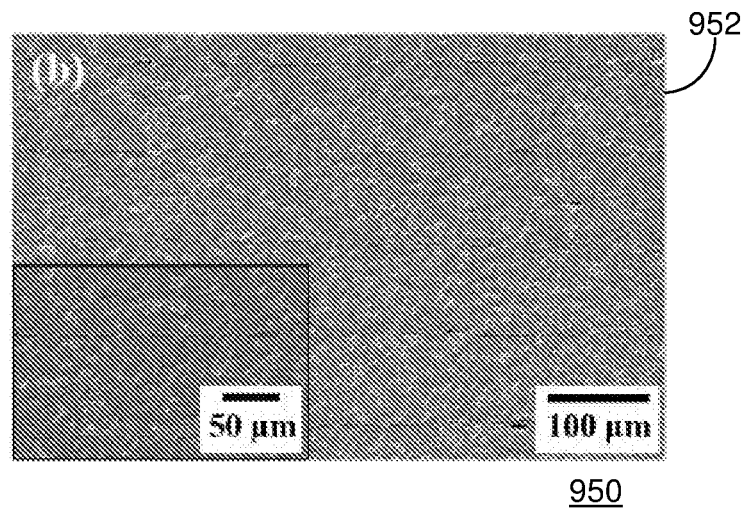

FIG. 9, comprising FIGS. 9A and 9B, depicts enlarged images 900, 950 of the $d_{31}$-mode multilayer piezoelectric actuators 502 fabricated by the fabrication process of FIG. 6 in accordance with the present embodiment, wherein the image 900 depicts a surface morphology 902 of the $d_{31}$-mode multilayer piezoelectric actuators 502 and the image 950 depicts a cross-section 952 of the $d_{31}$-mode multilayer piezoelectric actuators. From the surface morphology 902 and the cross section 952 of the co-fired $d_{31}$-mode multilayer piezoelectric actuators 502, it is shown that the actuators possess a dense structure with few isolated pores. No agglomerated secondary phase is observed in either the surface morphology 902 or the cross section 952 of the co-fired $d_{31}$-mode multilayer piezoelectric actuators 502.

The properties of a co-fired $d_{31}$-mode multilayer piezoelectric actuator 502 fabricated in accordance with the present embodiment are summarized in Table 1 below. The $d_{31}$-mode multilayer piezoelectric actuators 502 possess low dielectric loss and are appropriate for commercial applications. Furthermore, the $d_{31}$-mode multilayer piezoelectric actuators 502 possess a large piezoelectric $d_{33}$ and $d_{31}$ coefficients of about 412 pm/V and −185 pm/V, respectively.

TABLE 1

| Property (unit) | Value |
|---|---|
| Dielectric Constant at 1 kHz ($\varepsilon_{33}^T/\varepsilon_0$) | 2274 |
| Dielectric Loss at 1 kHz (%) | 2.4 |
| Longitudinal Piezoelectric Displacement Coefficient, $d_{33}$ (pm/V) | 412 |
| Transverse Piezoelectric Displacement Coefficient, d31 (pm/V) | −185 |

An electrical driver in a jet dispenser serves to provide the piezoelectric actuator with a high voltage to induce sufficient mechanical displacement for dispensing the fluid. It is critical that the voltage switching across the actuator is performed within a short timeframe so as to create a rapid displacing movement leading to a large piston force jetting out the pressurized fluid through the nozzle. As a piezoelectric actuator is typically capacitive by nature of its dielectric properties, it can take a considerable time to charge and discharge the actuator. As a result, the electrical driver in a jet dispenser is required to supply a large current output and a large current sink to facilitate the rapid charging and discharging of the piezoelectric actuator, respectively. The abilities of the electrical driver to supply and sink large current are, therefore, critical features which can determine the ultimate jetting performance of the dispenser.

In a conventional electrical driver, charging and discharging of the piezoelectric actuator are performed with a high voltage amplifier integrated circuit (IC) device whose output is directly connected to the actuator. Such conventional design has not been adequately configured for ultra-fast voltage switching across a capacitive load akin to a piezoelectric actuator. The reason is that an amplifier IC possesses a low slew-rate so that a substantial rise-time and fall-time are needed for voltage switching at its output even under an open-load condition. There is also a limit on the output current which can be supplied by an amplifier IC which consequentially results in a considerable charging time across the capacitive load. The current sink is also limited by the intrinsic output resistance of the amplifier IC such that it can undesirably lead to a slow discharging process on the actuator.

Figure 10:
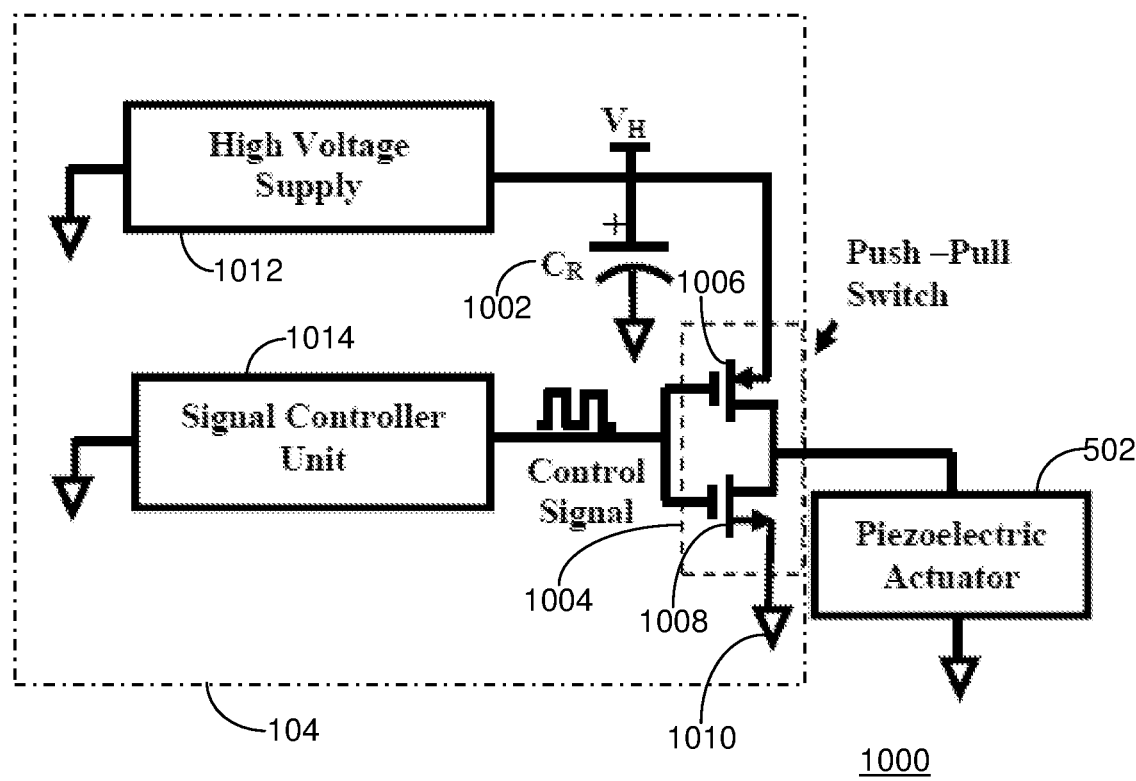
FIG. 10 depicts a circuit diagram of an electrical driver for driving piezoelectric actuators in accordance with the present embodiment.

Referring to FIG. 10, a circuit diagram 1000 depicts the electrical driver 104 for driving a single piezoelectric actuator 502 in accordance with the present embodiment. The electrical driver 104 in accordance with the present embodiment adopts a reserve capacitor 1002 dedicated to directly charging the piezoelectric actuator 502. A reserve capacitor 1002 is pre-charged to a predetermined high voltage level and then electrically connected across the actuator 502 via a low impedance push-pull switch 1004 comprising high power transistors 1006, 1008. Upon connecting to the reserve capacitor 1002, the piezoelectric actuator 502 takes up a huge in-rush current due to the capacitive property of the piezoelectric actuator 502. If such a huge in-rush current is fully utilized, it can bring an ultra-fast charging of the actuator 502. In accordance with the present embodiment, this in-rush current can be satisfied by the pre-charged reserve capacitor 1002 which is capable of releasing an extremely large transient current. Such transient current output from the reserve capacitor 1002 is significantly higher than the maximum allowable current output of a conventional amplifier IC and is only limited by the intrinsic series resistance of the piezoelectric actuator 502, the switch 1004 and the reserve capacitor 1002.

On the other hand, to discharge the actuator 502, the electrical driver 104 isolates the actuator 502 from the reserve capacitor 1002, and then discharges the actuator 502 into the electrical ground 1010 via the switch 1004. The switch 1004 is configured to possess very low output impedance so as to provide a large current sink in order to realize an ultra-fast discharge of the actuator 502.

The electrical driver 104 includes a high voltage supply 1012, the reserve capacitor (denoted as $C_R$) 1002, a signal controller 1014 and the push-pull switch 1004 coupled to the piezoelectric actuator 502. The high voltage supply 1012 outputs a high voltage, $V_H$, to charge up the reserve capacitor 1002 to the intended voltage prior to driving the actuator 502. The high voltage, $V_H$, can be generated by stepping up from a low voltage level, such as in a boost converter or charge pump. The reserve capacitor 1002 is connected to the actuator 502 via the push-pull switch 1004 which can be implemented with the complementary switching transistors 1006, 1008. In this way, the actuator 502 can be connected to the pre-charged reserve capacitor 1002 for charging and then to the electrical ground 1010 for discharging. Finally, the gate of the push-pull switch 1004 is coupled to the signal controller unit 1014 which outputs an electrical control signal for controlling the switching operation of the switch 1004.

Figure 11:
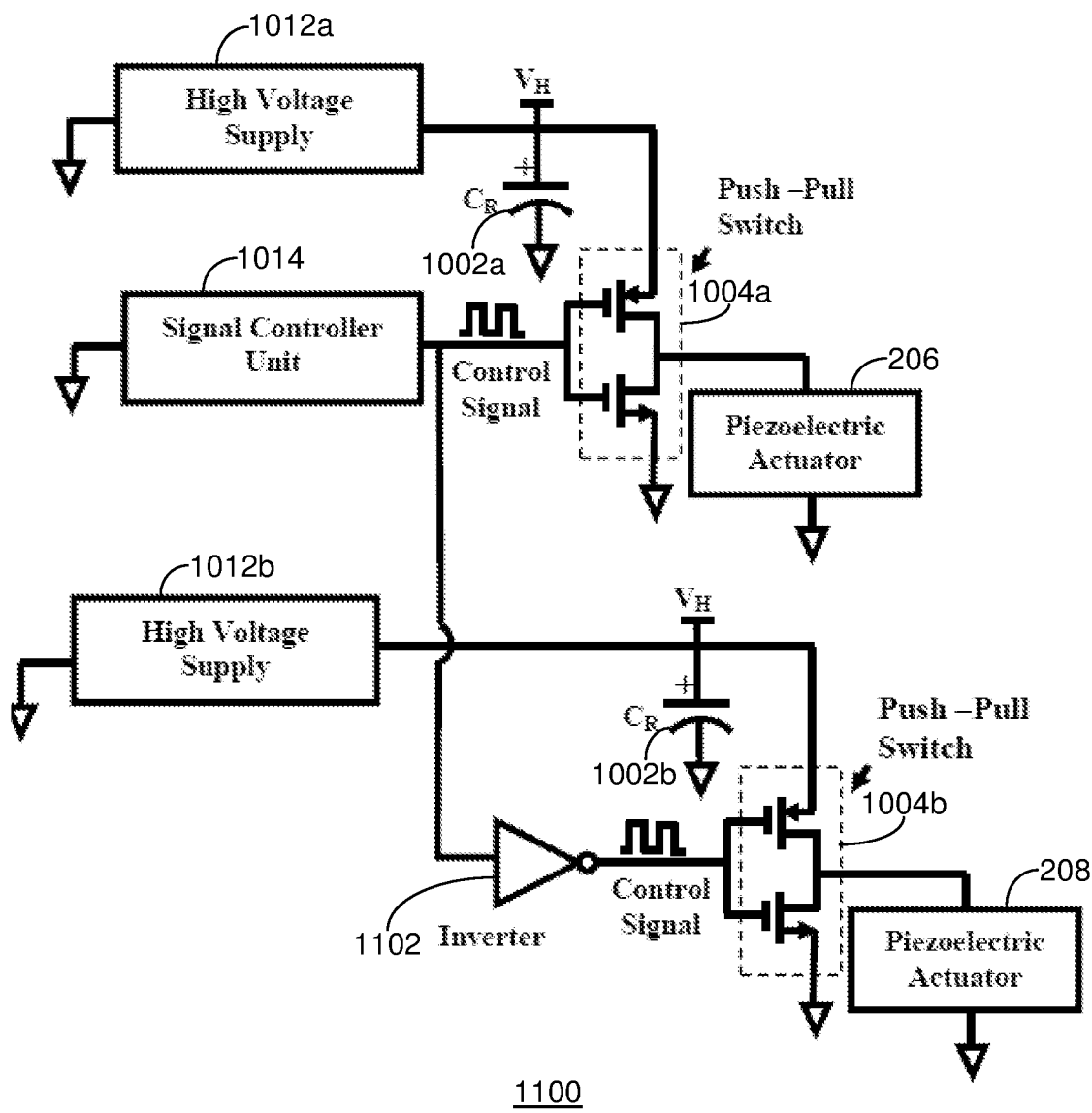
FIG. 11 depicts a circuit diagram of a circuit for anti-phase driving of dual piezoelectric actuators in accordance with the present embodiment.

Referring to FIG. 11, a circuit diagram 1100 of a circuit for anti-phase driving of the dual piezoelectric actuators 206, 208 in accordance with the present embodiment is depicted. The jet dispenser can deploy the dual piezoelectric actuators 206, 208 driven in an anti-phase manner so as to improve the piston 212 (FIG. 2) displacement and force the push-pull mode operation as described earlier. To implement this mechanism, the piezoelectric actuators 206, 208 are supplied with anti-phase driving voltages such that when one actuator (e.g., 206) is actively pushed up to the high voltage, the other actuator (e.g., 208) is simultaneously pulled down to the electrical ground. Such anti-phase driving can be achieved with two electrical drivers separately coupled to each of the piezoelectric actuators, the electrical drivers being controlled by digital signals in complementary voltage states. As depicted in the block diagram 1100, anti-phase driving on the piezoelectric actuators 206, 208 in accordance with the present embodiment utilizes two high voltage supplies 1012a, 1012b working with reserve capacitors 1002a, 1002b and push-pull switches 1004a, 1004b to power the piezoelectric actuators 206, 208. The push-pull switches 1004a, 1004b receive digital control signals from the signal controller unit 1014 in complementary voltage states achieved by an inverter 1102 inverting the digital control signals applied to the push-pull switch 1004a before providing it to the push-pull switch 1004b.

Figure 12:
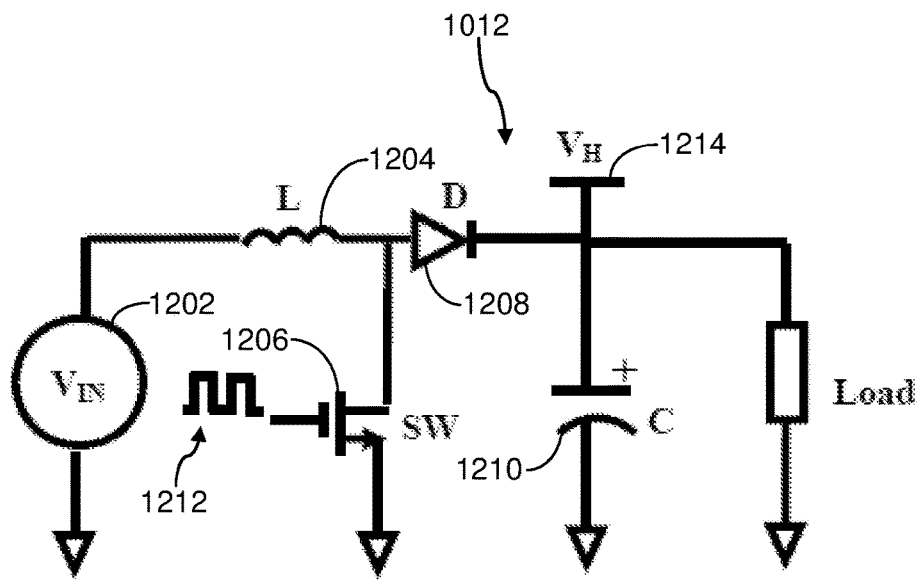
FIG. 12 depicts a circuit diagram of a boost converter circuit for realizing a high voltage supply for the circuits of FIGS. 10 and 11 in accordance with the present embodiment.

FIG. 12 depicts a circuit diagram 1200 of a boost converter circuit for realizing a high voltage supply for the circuits of FIGS. 10 and 11 in accordance with the present embodiment. The high voltage supply 1012 of the electrical driver 104 can be realized with a boost converter which is capable of converting a direct current (DC) low voltage to a DC high voltage, $V_H$. The boost converter can be constructed on a switching-mode power supply which includes a DC voltage source ($V_{IN}$) 1202, an inductor (L) 1204, a transistor switch (SW) 1206, a diode (D) 1208 and a capacitor (C) 1210 connected in accordance with the exemplary circuit depicted in the circuit diagram 1200.

As the transistor switch (SW) 1206 is triggered periodically by the alternating square pulse signal 1212 coupled to its gate terminal, the inductor (L) 1204 counteracts to the current changes by inducing a voltage across itself. The induced voltage across the inductor 1204 adds to the input voltage source ($V_{IN}$) to create an even higher voltage ($V_H$) 1214 for charging the capacitor (C) 1210. The diode (D) 1208 connected between the transistor switch 1206 and the capacitor 1210 prevents the capacitor 1210 from discharging through a back-flow current when the transistor switch 1206 is closed. Thus, the boost converter functions as a DC-DC converter providing a high voltage source 1012 for charging up a load which takes the form of the reserve capacitor 1002 (FIGS. 10, 11).

Figure 13:
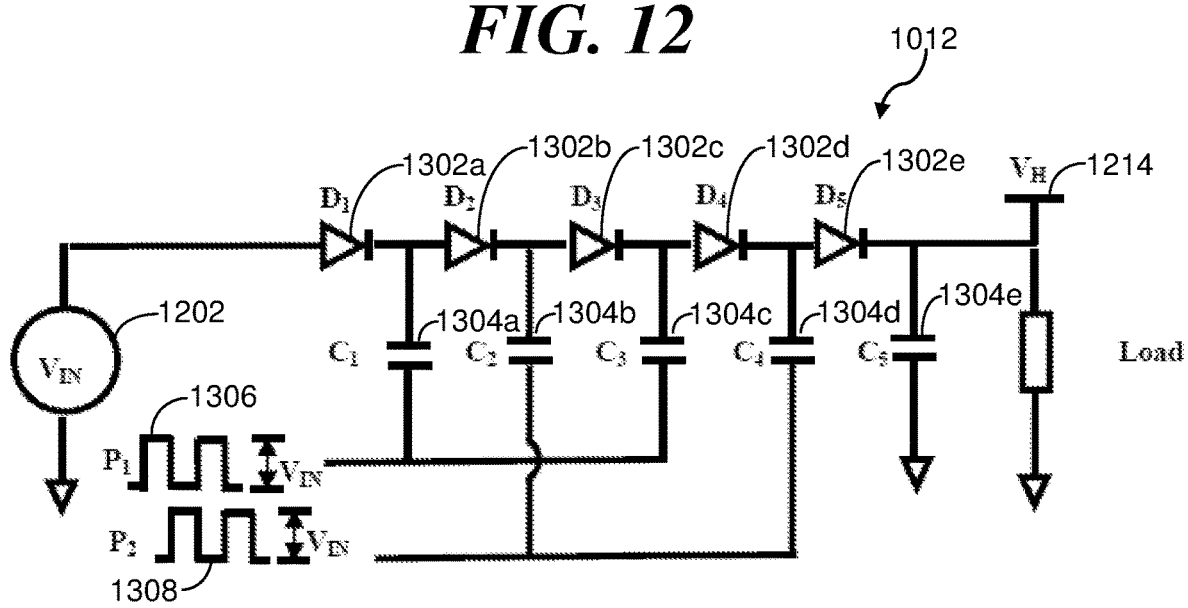
FIG. 13 depicts a circuit diagram of a charge pump based on Dickson's model with diodes as the switching devices for realizing the high voltage supply for the circuits in FIGS. 10 and 11 in accordance with the present embodiment.

FIG. 13 depicts a circuit diagram 1300 of a charge pump based on Dickson's model with diodes 1302 as the switching devices in accordance with the present embodiment. The high voltage supply 1012 of the electrical driver 104 can alternatively be realized with a charge-pump circuit to multiply a DC low voltage so as to achieve a considerably much higher DC voltage level, $V_H$. A charge-pump circuit comprises capacitors 1304 arranged in multiple stages, and makes use of a switching mechanism to charge and step up the voltages of each of the capacitors 1304 sequentially. An example of such a charge-pump includes that of Dickson's model which comprises a DC low voltage input ($V_{IN}$) 1202, capacitors ($C_1$-$C_5$) 1304 and diodes ($D_1$-$D_5$) 1302 in the circuit arrangement as illustrated in the circuit diagram 1300, driven by two switching pulses ($P_1$ 1306 and $P_2$ 1308) anti-phase to each other.

The charge-pump in the circuit diagram 1300 operates by turning on the first diode $D_1$ 1302a to charge up the first capacitor $C_1$ 1304a to $V_{IN}$ while $P_1$ 1306 is in a low state and, simultaneously, turning off the second diode $D_2$ 1302b while $P_2$ 1308 is in a high state ($P_2$ 1308 being anti-phase to $P_1$ 1306) to prevent $C_1$ 1304a from discharging. As $P_1$ 1306 and $P_2$ 1308 reverse their respective states, $D_1$ 1302a is turned off so as to step up $C_1$ 1304a to a voltage two times $V_{IN}$, and $D_2$ 1302b is turned on to charge up the second capacitor $C_2$ 1304b to the voltage of two times V. At the same time, the third diode $D_3$ 1302c is turned off to prevent $C_2$ 1304b from discharging. The cycle is repeated in the subsequent stages so that $C_3$ 1304c is further stepped up to three times $V_{IN}$, $C_4$ 1304d to four times $V_{IN}$ and $C_5$ 1304e to five times $V_{IN}$. The stages can even be extended until eventually the desired high voltage $V_H$ 1214 is achieved at the output to charge up the load which takes the form of the reserve capacitor 1002.

It is to be emphasized that the above circuit diagram 1200 and 1300 are illustrative examples of how the high voltage supply 1012 can be implemented in accordance with the present embodiment and are not meant to restrict the high voltage supply 1012 to any particular circuit design. The high voltage supply 1012 can be based on a variety of known circuit topologies to perform step-up DC-to-DC conversion, including those adapted from Buck-boost circuits, Split-pi circuits and Joule thief circuits. The high voltage supply 1012 may even generate its DC voltage output from an alternating current (AC) voltage input instead of a DC voltage input based on conventional voltage multiplier topologies such as those adapted from Cockcroft Walton or Villard Cascade models. Furthermore, the high voltage supply 1012 can also combine two or more different circuit topologies to achieve the desired DC voltage output for charging up the reserve capacitor 1002.

In accordance with a further aspect of the present embodiment, the high voltage supply 1012 can be implemented on specialized integrated circuit (IC) devices to achieve a high DC voltage for charging the reserve capacitor 1002. Such specialized IC devices may be adapted from known circuit topologies for voltage boosting such as the Dickson's model described in regards to the circuit diagram 1300. Examples of such IC devices for creating a high voltage supply include an ADP1613 IC device (from Analog Devices, USA), a Max1044 IC device (from Maxim Integrated, USA) and a TPS61175 IC device (from Texas Instruments, USA).

The reserve capacitor 1002 is preferred to possess a capacitance value far exceeding that of the piezoelectric actuators 206, 208, so as to prevent its voltage from being pulled down significantly when charging the capacitive load. Additionally, the reserve capacitor 1002 should possess sufficient voltage tolerance above the intended voltage level for driving the piezoelectric actuators 206, 208 and the voltage level $V_H$ 1214 generated by the high voltage supply 1012. It is also preferred that the reserve capacitor 1002 possesses strong tolerance to low ohmic charging in order to enable rapid charge replenishment by the high voltage supply, as well as strong tolerance to low ohmic discharging in order to accommodate the large in-rush current upon connecting to the capacitive piezoelectric actuators 206, 208.

In these regards, the reserve capacitor 1002 can be implemented with electrolyte capacitors which can viably provide for the three requirements simultaneously: high capacitance, high voltage tolerance and accommodatability to large charging and discharging currents. The reserve capacitance may also be implemented on other types of capacitors, including those of tantalum, ceramics and polymers, as long as the capacitor satisfies the abovementioned requirements.

The reserve capacitor 1002 may also be implemented not with just a single capacitor, but on a plurality of capacitors electrically connected to each other. In one embodiment, the capacitors may be connected in parallel so as to enlarge the effective capacitance for the reserved charge. Such parallelly connected capacitors can desirably increase the overall tolerance of the reserve capacitor 1002 to the huge in-rush current upon connecting to the capacitive piezoelectric actuators 206, 208. In another embodiment, the capacitors may be connected serially to increase the effective voltage tolerance to allow an even higher voltage to be deployed for driving the actuators 206, 208.

The push-pull switch 1004 serves to alternately connect the piezoelectric actuators 206, 208 to the reserve capacitor 1002 for charging the actuators 206, 208, or to the electrical ground 1010 for discharging the actuators 206, 208. The connection of the actuators 206, 208 to the reserve capacitor 1002 or the electrical ground 1010 by the push-pull switch 1004 is configured to be mutually exclusive, so as to ensure that the charging and discharging are performed alternately. Correspondingly the switching states of the push-up and pull-down circuitry are configured to be complementary to each other, such that when the push-up circuitry is on, the pull-down circuitry is off, and vice-versa. This prevents direct discharge of the reserve capacitor 1002 to the electrical ground 1010 when both the push-up and pull-down circuitries are turned on simultaneously, thereby preventing a devastatingly huge current surge capable of destroying the electrical driver circuitry 104.

Figure 14:
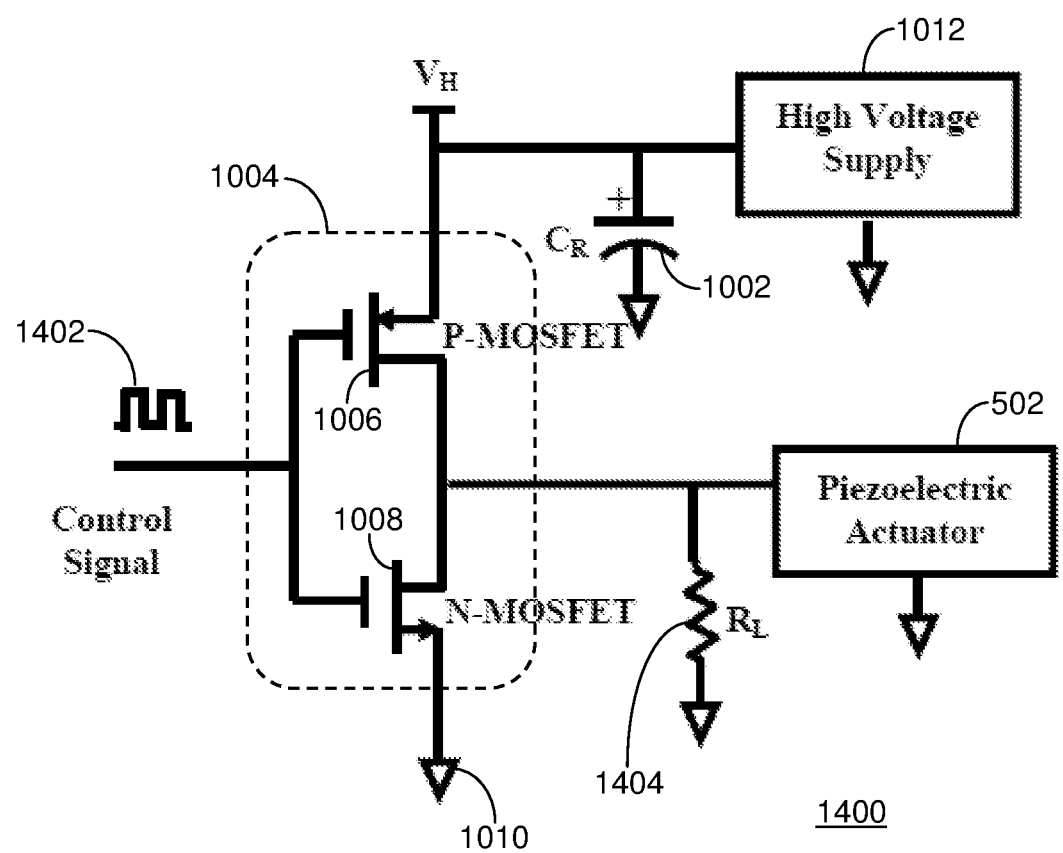
FIG. 14 depicts a circuit diagram of a push-pull switch comprising a push-up transistor and a pull-down transistor in accordance with the present embodiment.

FIG. 14 depicts a circuit diagram 1400 of a push-pull transistor switch 1004 in accordance with the present embodiment. The push-pull switch 1004 can be implemented with two transistors 1006, 1008 of a P-MOSFET type and a N-MOSFET type, respectively. The drain terminals of the two transistors 1006, 1008 are commonly coupled to the piezoelectric actuator 502, while their gate terminals are also commonly coupled to a control signal 1402 (e.g., a digital control signal from the signal controller unit 1014). The source terminal of the P-MOSFET 1006 is connected to the reserve capacitor 1002 so that the P-MOSFET 1006 serves as a push-up transistor for charging the actuator 502. On the other hand, the source of the N-MOSFET 1008 is connected to the electrical ground 1010 so that the N-MOSFET 1008 serves as a pull-down transistor for discharging the actuator 502. A high value resistor $R_L$ 1404 may be connected at the P-MOSFET 1006 drain terminal in parallel with the actuator 502 so as to facilitate the switching operation of the transistor 1006.

As the control signal 1402 enters into the low-state, the P-MOSFET 1006 is turned on to connect the actuator 502 to the reserve capacitor 1002. The stored electrical charge in the reserve capacitor 1002 is transferred to the actuator 502, thereby driving the actuator 502 by charging it to displace it towards the intended direction. At the same time, the N-MOSFET 1008 is turned off to prevent any current from discharging from the reserve capacitor 1002 or from the capacitive actuator 502 to the electrical ground 1010.

On the other hand, as the control signal 1402 enters into the high-state, the N-MOSFET 1008 is turned on. The piezoelectric actuator 502 discharges into the electrical ground 1010 so that the actuator 502 returns to its original relaxed position. At the same time, the P-MOSFET 1006 is turned off to prevent the reserve capacitor 1002 from discharging to the electrical ground 1010.

Figure 15:
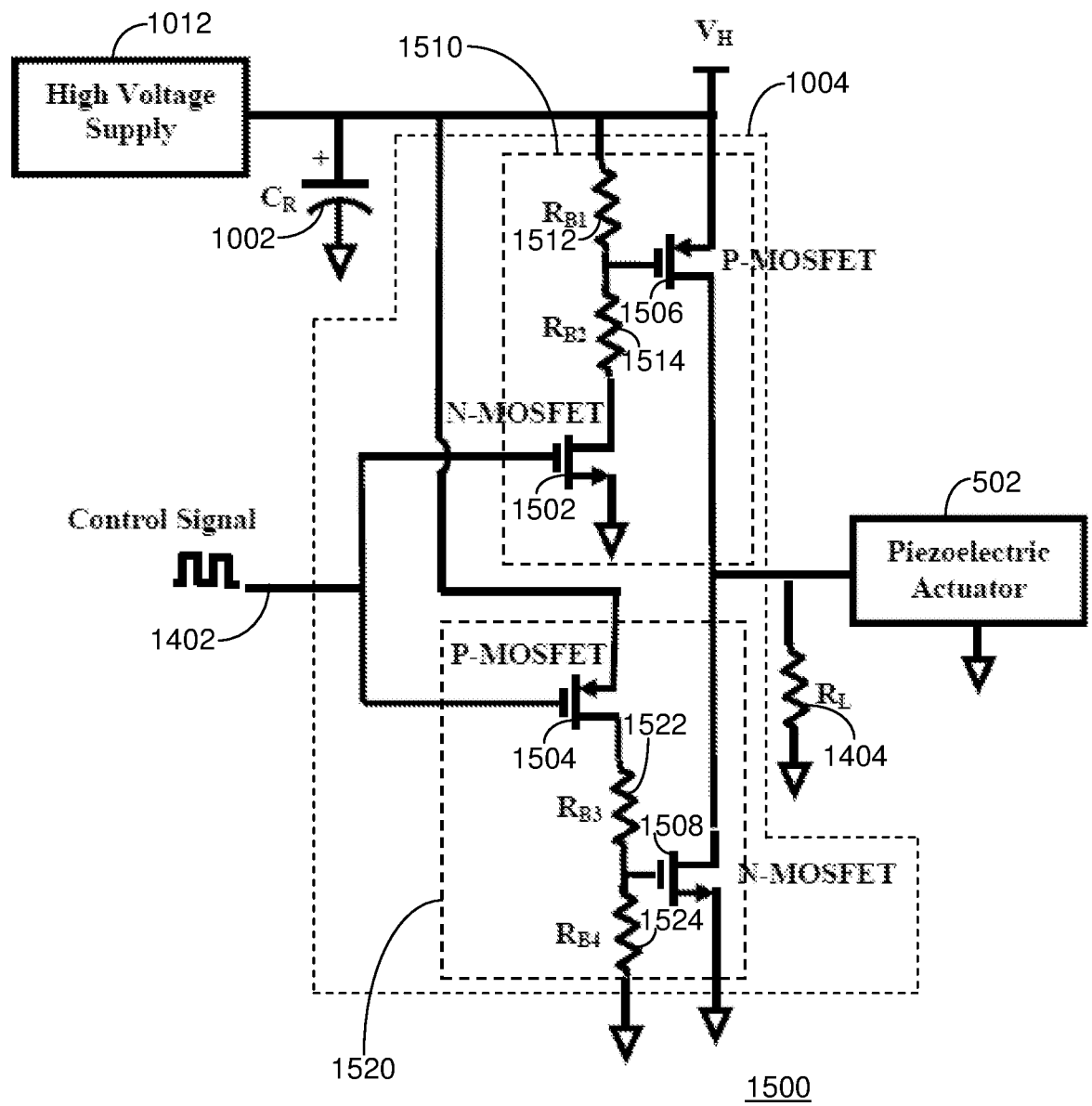
FIG. 15 depicts a circuit diagram of a push-pull switch comprising cascading transistor pairs for the push-up and pull-down circuitries in accordance with the present embodiment.

Referring to FIG. 15, a circuit diagram 1500 of another embodiment of the push-pull transistor switch 1004 using a cascading transistor pair in accordance with the present embodiment is depicted. The exemplary push-pull switch 1004 implemented on cascading transistor pairs for the push-up and pull-down circuitries for charging and discharging the actuator 502 are each implemented on a pair of transistors in a cascading arrangement, instead of the single transistor depicted in the circuit diagram 1400. Such cascading arrangement comprises first-stage transistors 1502, 1504 and second-stage transistors 1506, 1508, whereby the drain of the first-stage transistors 1502, 1504 are coupled to gates of the second-stage transistors 1506, 1508. The first-stage transistors 1502, 1504 are also coupled to the control signal 1402 at their gate terminals, while the second-stage transistors 1506, 1508 are coupled to the piezoelectric actuator 502 at their drain terminals. Such cascading transistor arrangement can produce a more responsive and faster voltage switching than a single transistor and can be configured to provide a very low resistance drain path for facilitating high current charging and discharging of the piezoelectric actuator 502.

In the push-up circuitry 1510, the drain of the N-MOSFET 1502 is coupled to the gate of the P-MOSFET 1506 via a voltage divider comprised of resistors $R_{B1}$ 1512 and $R_{B2}$ 1514. On the other hand, in the pull-down circuitry 1520, the drain of the P-MOSFET 1504 is coupled to the gate of the N-MOSFET 1508 via a voltage divider comprised of resistors $R_{B3}$ 1522 and $R_{B4}$ 1524. The voltage dividers serve to step down the voltage at the gate terminals of the second-stage transistors 1506, 1508 to protect the transistors 1506, 1508 from damage by an output directly drawn from the high voltage supply 1012.

Both the first-stage transistors 1502, 1504 of the push-up and pull-down circuitries are commonly coupled to the control signal 1402 at the gate terminals. As the control signal 1402 enters into its high state, the push-up circuitry 1510 is turned on and the pull-down circuitry 1520 is turned off to charge up the actuator 502. On the other hand, as the control signal 1402 enters into its low state, the pull-down circuitry 1520 is turned on and the push-up circuitry 1510 is turned off to discharge the actuator 502.

Figure 16:
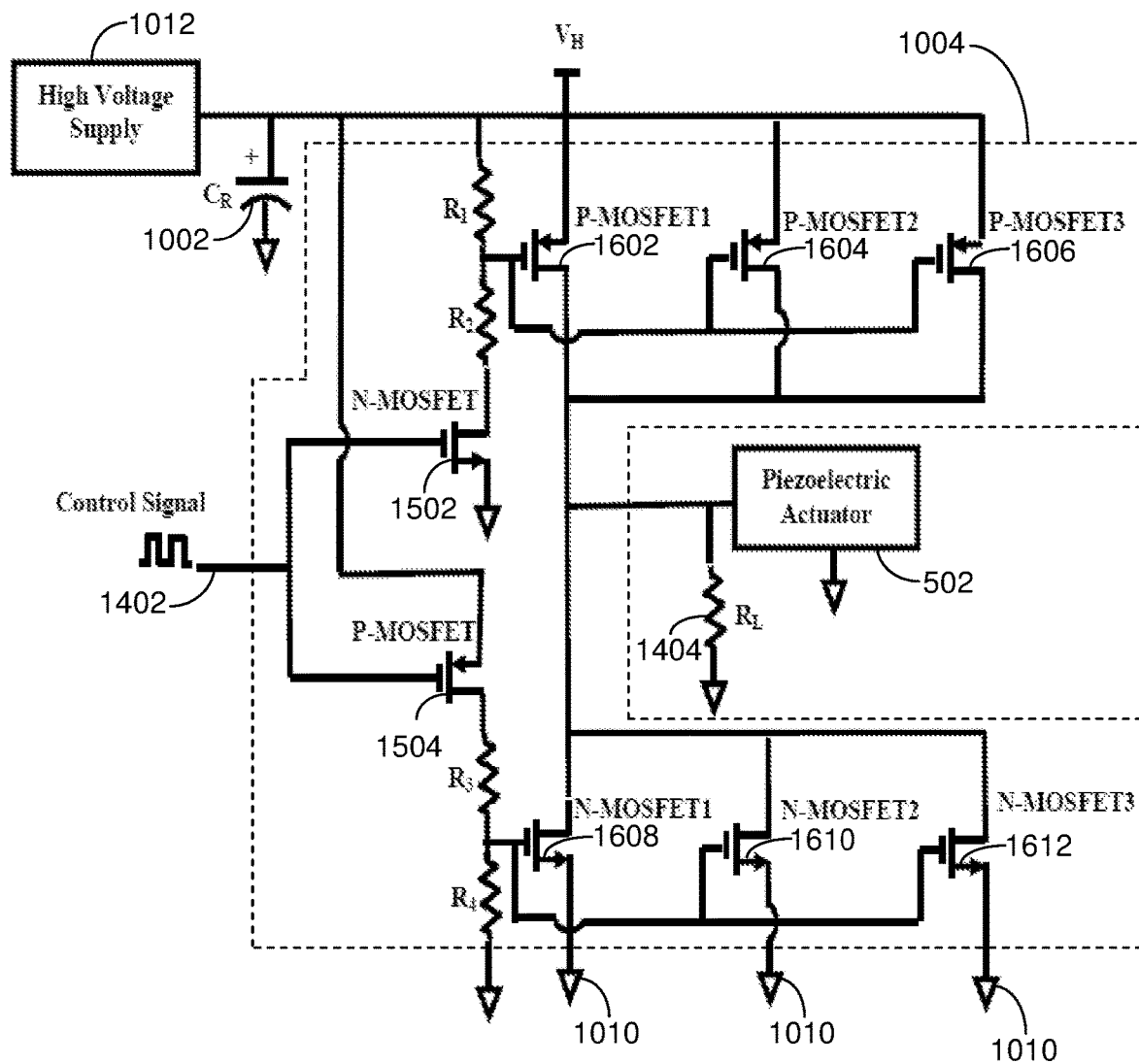
FIG. 16 depicts a circuit diagram of a push-pull switch implemented on an array of parallel transistors for driving the piezoelectric actuator in accordance with the present embodiment.

Referring to FIG. 16, a circuit diagram 1600 depicts yet another embodiment of the push-pull transistor switch 1004 implemented on an array of parallel transistors 1602, 1604, 1606, 1608, 1610, 1612 for driving the piezoelectric actuator 502 in accordance with the present embodiment. All of the transistors 1602, 1604, 1606, 1608, 1610, 1612 are coupled to the piezoelectric actuator 502 at the drain terminals. The array of parallel transistors includes three P-MOSFETs 1602, 1604, 1606 and three N-MOSFETs 1608, 1610, 1612 that are used for charging and discharging the actuator 502, respectively. Such a circuit arrangement reduces the effective drain resistance of the push-up and pull-down circuitries so as to induce an even larger transient current rushing into the piezoelectric actuator 502 upon connecting to the reserve capacitor 1002. Additionally, a larger discharge current can also be enabled upon pulling down the actuator 502 to the electrical ground 1010. Furthermore, by using multiple transistors in parallel to concurrently drive the actuator 502, the push-up and pull-down circuitries can possess a greater tolerance to the huge transient current deliberately designed for in the electrical driver 104.

It is to be emphasized that the push-pull switches 1004 in the circuit diagrams 1400, 1500, 1600 are illustrative examples on push-pull switch implementations in accordance with the present embodiment and are not meant to restrict the present embodiment to adopt any particular circuit configuration. Thus, the push-pull switch 1004 may be implemented in any circuit configuration as long as it can connect the actuator 502 to the reserve capacitor 1002 for facilitating charging and also connect the actuator 502 to the electrical ground 1010 for discharging. The transistors are not confined to MOSFET devices, but may include bipolar junction transistors (BJTs), junction gate field-effect transistors (JFETs) or insulated gate bipolar transistor (IGBTs). The push-pull switch 1004 may not even be implemented on transistors but on other kinds of switching devices such as relays.

Figure 17:
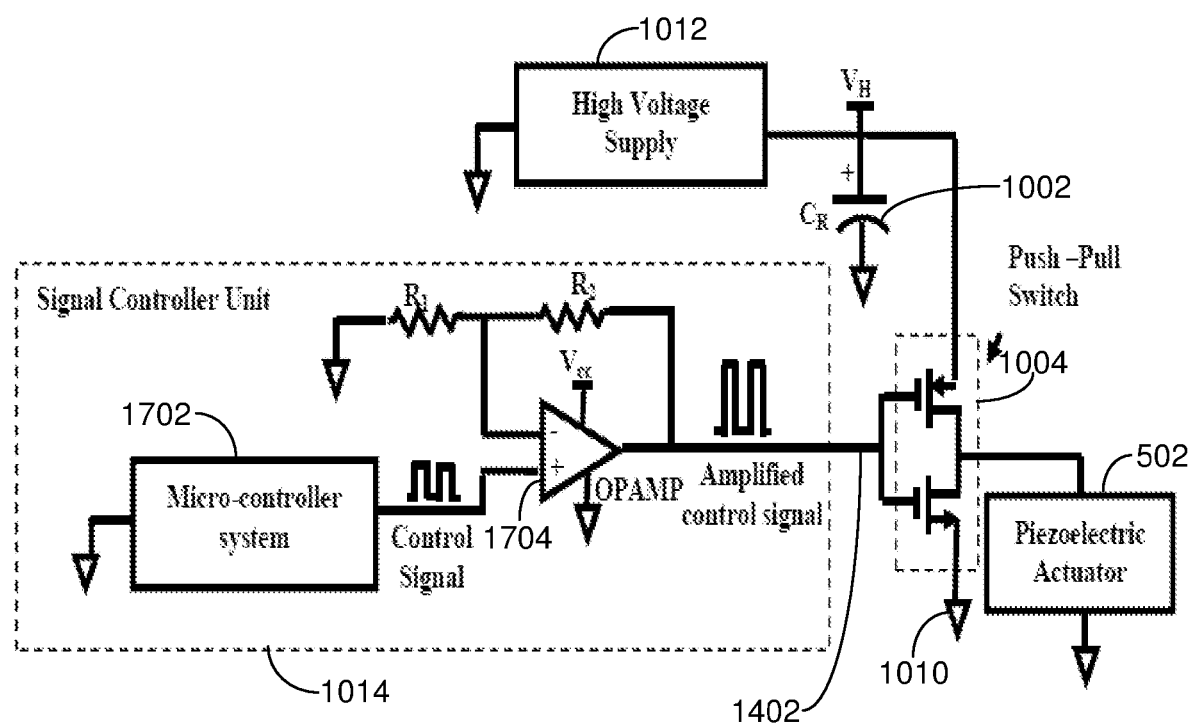
FIG. 17 depicts a circuit diagram of an electrical driver in accordance with the present embodiment which includes a signal controller unit implemented on a microcontroller system coupled to an amplifier circuit.

FIG. 17 depicts a circuit diagram of the electrical driver 104 in accordance with the present embodiment which includes a signal controller unit 1014 implemented with a microcontroller system 1702 coupled to an amplifier circuit 1704. The signal controller unit 1014 provides controlling signals 1402 to the push-pull switch 1004 to charge and discharge the actuator 502. The control signal 1402 may take the form of a digital square pulse whereby the frequency of the pulse determines the frequency of the actuation and the pulse width determines the length of time the actuator 502 remains in its displaced position. The control signals 1402 as generated by the signal controller unit 1014 should possess a sufficiently high voltage level to exceed the turn-on threshold of the push-pull transistors of the push-pull switch 1004, but be below the maximum voltage rating of the push-pull transistors' gate terminals.

The signal controller unit 1014 may be implemented on a microcontroller or any digital system which can be configured to output the required digital control signals 1402. The microcontroller or digital system may be further assisted by analog circuitry such as an amplifier 1704 to amplify the output control signals 1402 to an optimum voltage level before coupling to the push-pull switch 1004.

Figure 18A:
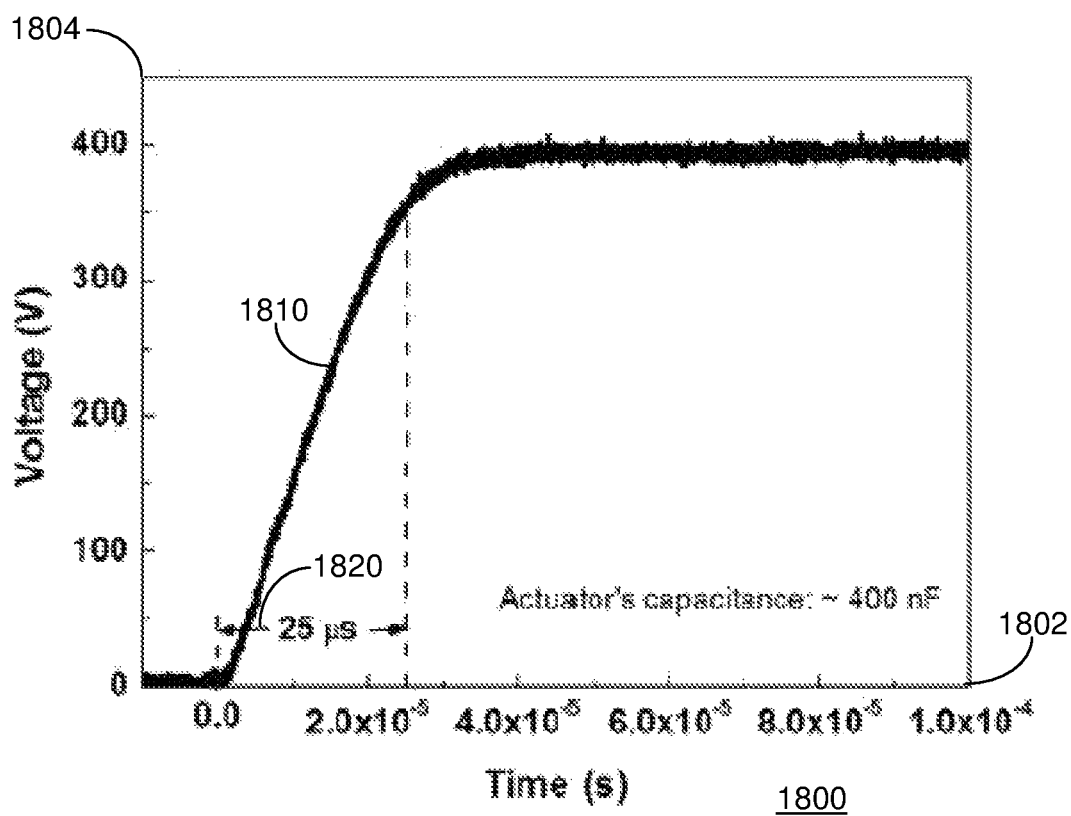
Figure 18B:
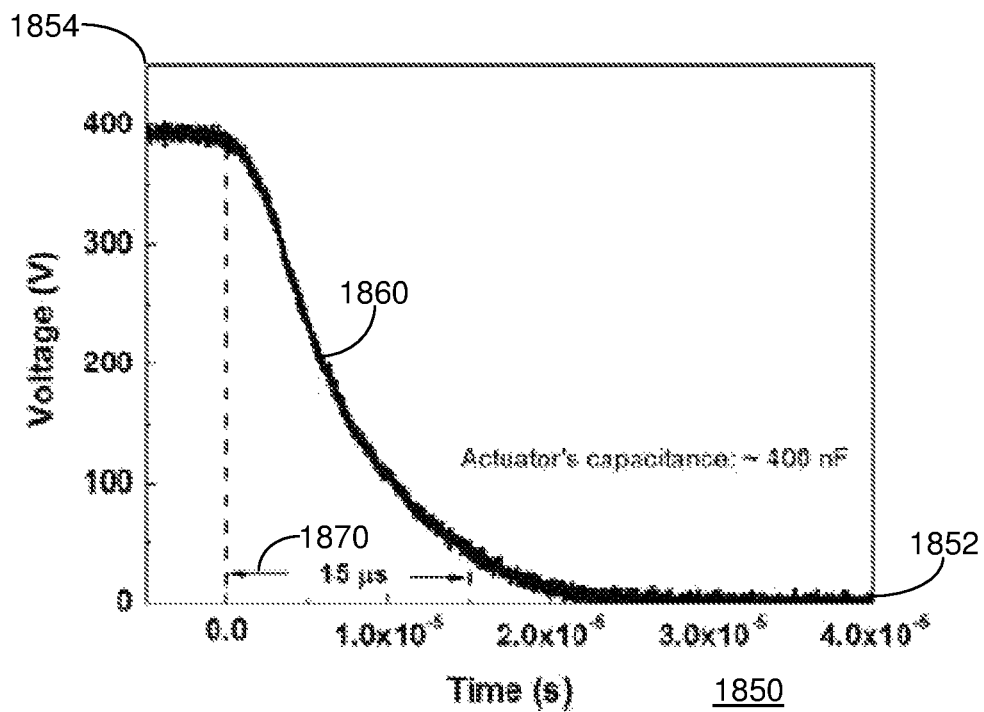

FIG. 18, comprising FIGS. 18A and 18B, depicts graphs 1800, 1850 of charging and discharging profiles across the piezoelectric actuator 502 in accordance with the present embodiment, wherein time is plotted along x-axes 1802, 1852 and voltage is plotted along y-axes 1804, 1854. The graph 1800 depicts a charging profile 1810 across the piezoelectric actuator 502 exhibiting a rise-time 1820 of twenty-five microseconds and the graph 1850 depicts a discharging profile 1860 across the piezoelectric actuator 502 exhibiting a fall-time 1870 of fifteen microseconds. The rate at which the capacitive piezoelectric actuator 502 in accordance with the present embodiment is being charged and discharged is significantly faster than charging and discharging of conventional capacitive piezoelectric actuators by conventional electrical drivers.

Figure 19:
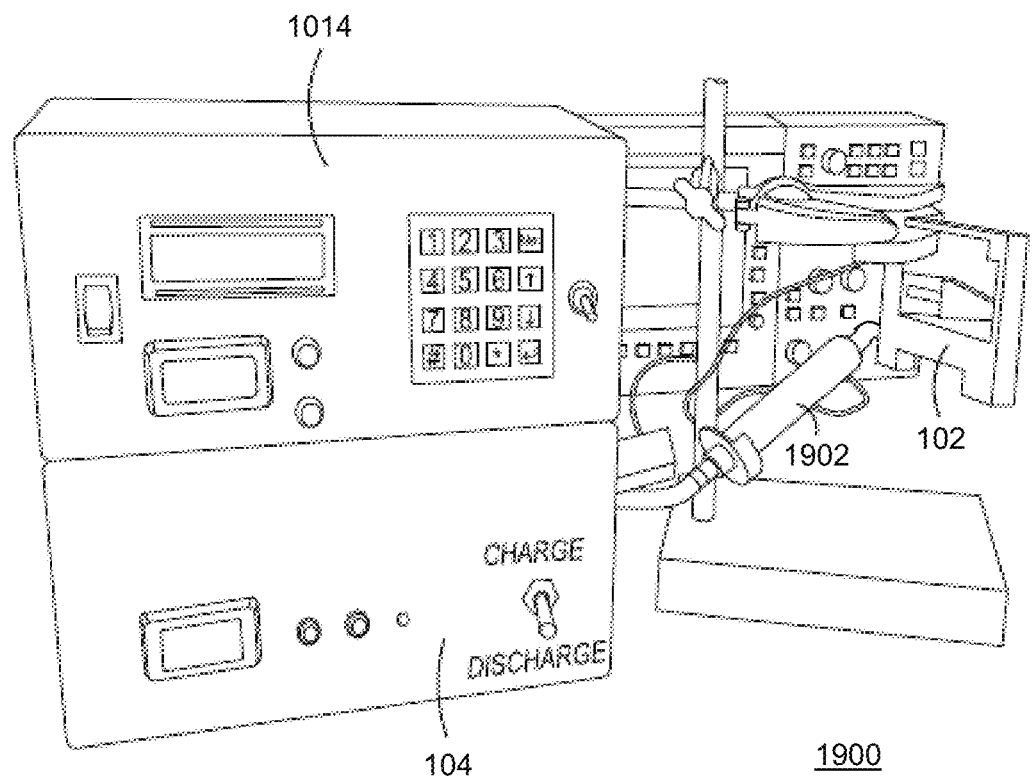
FIG. 19 depicts a view of a fluid jet dispenser in accordance with the present embodiment.

FIG. 19 depicts a view 1900 of a fluid jet dispenser in accordance with the present embodiment capable of jetting fluidics with high viscosity. The actuators 206, 208 of the exemplary assembly had dimensions of 26×5×4.5 mm$^3$ and had a longitudinal displacement of about 10.2-12.5 μm under an applied peak-to-peak high voltage of 360V. The nozzle 214 opening was 300 μm. A pressurized fluid supply 1902 provided fluid to the fluidic passageways 204 of the dispenser head 102. While having only one active actuator, the piston displacement was about 60 μm under an applied peak-to-peak high voltage of about 360 V. The piston displacement increased to about 120 μm when both of the actuators 206, 208 were simultaneously driven by two antiphase driving voltages of the same amplitude of about 360 V. These results are consistent with the simulation results depicted in the simulation perspective views 300, 400.

Figure 20:
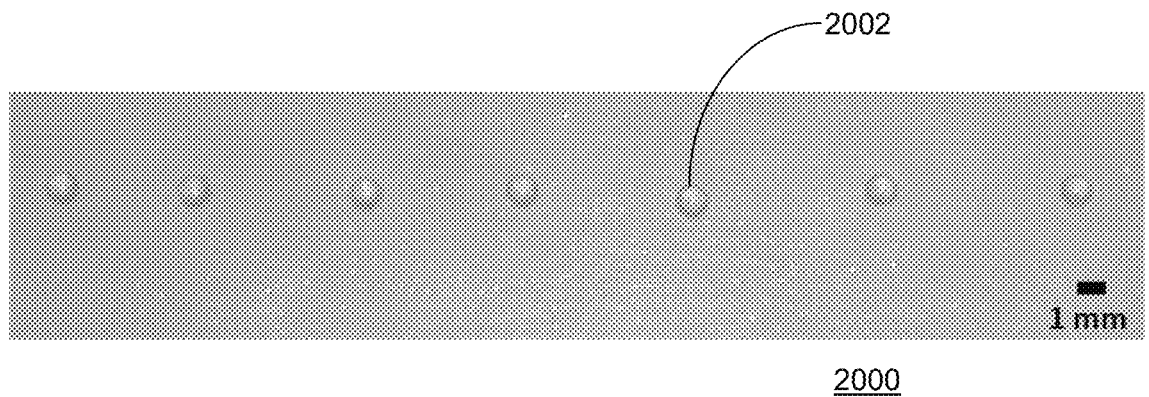
FIG. 20 depicts a top planar view of test fluid jetted by the fluid jet dispenser of FIG. 19 in accordance with the present embodiment.

FIG. 20 depicts a top planar view 2000 of test fluid droplets 2002 jetted by the fluid jet dispenser illustrated FIG. 19 in accordance with the present embodiment. The pressure of the fluid within the pressurized fluid supply 1902 was maintained at about 2 bars to ensure continuous flow of fluid through the fluidic passageways 204. The tested fluid was a commercial epoxy having a viscosity of 20000 cps. However, the exemplary embodiment is not limited to such fluidics and may be applied to jet different types of fluids. The droplets 2002 have uniform size and shape without any satellites or bubbles.

Thus, it can be seen that the present embodiment can provide fluid jet dispensers utilizing specifically designed multilayer piezoelectric actuators which are of low cost and can be produced by highly scalable fabrication methods. The disclosed fluid jet dispenser according to the present embodiment is capable of high speed dispensing actuation with high voltage push-pull actuation of the multilayer piezoelectric actuators. The dual actuator anti-phase operation provides stable and uniform droplet formation, even for a high viscosity fluid.

While exemplary embodiments have been presented in the foregoing detailed description of the invention, it should be appreciated that a vast number of variations exist. It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of steps and method of operation described in the exemplary embodiment without departing from the scope of the invention as set forth in the appended claims.

What is claimed is:

1. A fluid jet dispenser comprising:
a support frame having a fluid passageway;
a fluid chamber for containing a pressurized fluid and coupled to the fluid passageway;
a piston;
a nozzle; and
a dispensing head comprising:
at least two $d_{31}$-mode multilayer piezoelectric actuators, each comprising multiple electrode layers and multiple piezoelectric layers, wherein the multiple piezoelectric layers comprise $d_{31}$-mode piezoelectric layers with polarization substantially perpendicular to a utilized displacement direction of the piezoelectric actuator upon charging of the piezoelectric actuator; and
an electrical driver electrically coupled to the at least two $d_{31}$-mode multilayer piezoelectric actuators and configured to deliver anti-phase driving pulses to the at least two $d_{31}$-mode multilayer piezoelectric actuators to charge and discharge the at least two $d_{31}$-mode multilayer piezoelectric actuators to drive them backward and forward in anti-phase mechanical displacement in the utilized displacement direction, and
wherein the piston is coupled to the at least two $d_{31}$-mode multilayer piezoelectric actuators configured to dispense the pressurized fluid through the nozzle in response to the anti-phase mechanical displacement thereof.

2. The fluid jet dispenser, in accordance with claim 1, further comprising a displacement magnifying element coupled between the at least two $d_{31}$-mode multilayer piezoelectric actuators and the piston and configured to move the piston relative to the nozzle between an open position to let the pressurized fluid flow from the nozzle and a closed position to establish a fluid seal between the fluid passageway and the nozzle.

3. The fluid jet dispenser, in accordance with claim 1, wherein the at least two $d_{31}$-mode multilayer piezoelectric actuators comprise multiple piezoelectric ceramic layers comprising a ceramic composition having a sintering temperature of 950° C. or below.

4. The fluid jet dispenser, in accordance with claim 3, wherein the multiple metal layers comprise one or more metals selected from the group comprising silver, a nickel alloy, a copper alloy, or a silver-palladium alloy having a low palladium concentration of ≤10 wt %.

5. The fluid dispenser, in accordance with claim 1, wherein each of the multiple piezoelectric layers has a perovskite phase which is substantially away from a morphotropic phase boundary of the piezoelectric ceramic composition of the multiple piezoelectric layers.

6. A fluid dispenser comprising: a dispensing head comprising:
at least two $d_{31}$-mode multilayer piezoelectric actuators, each comprising multiple electrode layers and multiple piezoelectric layers, wherein the multiple piezoelectric layers comprise $d_{31}$-mode piezoelectric layers with polarization substantially perpendicular to a utilized displacement direction of the piezoelectric actuator upon charging of the piezoelectric actuator; and
an electrical driver electrically coupled to the at least two $d_{31}$-mode multilayer piezoelectric actuators for charging and discharging the at least two $d_{31}$-mode multilayer piezoelectric actuators to drive them backward and forward in the utilized displacement direction, wherein each of the multiple piezoelectric layers comprises a piezoelectric ceramic composition having a perovskite phase which is substantially away from a morphotropic phase boundary, and wherein the piezoelectric ceramic composition includes $0.1Pb(N_{1/3}Nb_{2/3})O_3$-$0.35Pb(Zn_{1/3}Nb_{2/3})O_3$-$0.15Pb(Mg_{1/3}Nb_{2/3})O_3$-$0.1PbZrO_3$-$0.3PbTiO_3$ with 4 mol % excess NiO (0.1PNN-0.35PZN-0.15PMN-0.10PZ-0.3PT-0.04NiO).

7. The fluid jet dispenser, in accordance with claim 1, wherein the anti-phase mechanical displacement of the at least two $d_{31}$-mode multilayer piezoelectric actuators is configured to induce a push-pull force on the piston.

8. The fluid jet dispenser in accordance with claim 1, wherein the electrical driver comprises at least two electrical driver circuits, each of the at least two electrical driver circuits coupled to one of the at least two $d_{31}$-mode multilayer piezoelectric actuators, and wherein each of the at least two electrical driver circuits is configured to supply one of the anti-phase driving pulses to one of the at least two $d_{31}$-mode multilayer piezoelectric actuators to generate the anti-phase mechanical displacement of the one of the at least two $d_{31}$-mode multilayer piezoelectric actuators.

9. The fluid jet dispenser in accordance with claim 1, wherein the electrical driver comprises:
a reserve capacitor;
a high voltage supply; coupled to the reserve capacitor and configured to charge the reserve capacitor;
a push-pull switch coupled to the reserve capacitor, electrical ground and the at least two $d_{31}$-mode multilayer piezoelectric actuators, the push-pull switch configured to charge and discharge the at least two $d_{31}$-mode multilayer piezoelectric actuators by alternately coupling each of the at least two $d_{31}$-mode multilayer piezoelectric actuators to the reserve capacitor for charging or to the electrical ground for discharging; and
a signal controller unit configured to provide control signals to the push-pull switch to charge and discharge the at least two $d_{31}$-mode multilayer piezoelectric actuators.

10. The fluid jet dispenser in accordance with claim 9, wherein the reserve capacitor is configured to be precharged by the high voltage supply to provide a huge transient current to charge the at least two $d_{31}$-mode multilayer piezoelectric actuators rapidly when coupled to the at least two $d_{31}$-mode multilayer piezoelectric actuators by the push-pull switch.

11. The fluid jet dispenser in accordance with claim 9, wherein the reserve capacitor is configured to store an electrical output of the high voltage supply for pre-charging thereof, and wherein the reserve capacitor consists of one or more of an electrolyte capacitor, a ceramic capacitor, a tantalum capacitor, or a polymer capacitor.

12. The fluid jet dispenser in accordance with claim 9, wherein the push-pull switch comprises a push-up circuitry configured to be switched on to electrically connect one or more of the at least two $d_{31}$-mode multilayer piezoelectric actuators to the reserve capacitor for charging, and a pull-down circuitry configured to be switched on to electrically connect one or more of the at least two $d_{31}$-mode multilayer piezoelectric actuators to the electrical ground for discharging, wherein the switching states of the push-up circuitry and the pull-down circuitry are configured to be complementary to each other.

13. The fluid jet dispenser in accordance with claim 12, wherein the push-up circuitry and the pull-down circuitry each comprises a pair of transistors in a cascading arrangement.

14. The fluid jet dispenser in accordance with claim 9, wherein the high voltage supply comprises a boost converter or a charge pump and is configured to generate a high voltage level output by stepping up from a low voltage level.

15. A piezoelectric ceramic actuator comprising:
multiple metal electrode layers; and
multiple piezoelectric ceramic layers, wherein the multiple piezoelectric ceramic layers comprise $d_{31}$-mode piezoelectric layers, and wherein a polarization of the $d_{31}$-mode piezoelectric layers is substantially perpendicular to a direction of utilized displacement of the piezoelectric ceramic actuator upon charging of the piezoelectric ceramic actuator, and
wherein the $d_{31}$-mode piezoelectric layers comprise a ceramic composition having a sintering temperature of 950° C. or below, and
wherein the multiple metal electrode layers comprise metal selected from the group comprising silver (Ag), a silver palladium alloy (Ag/Pd alloy) having a low palladium concentration of ≤10 wt %, nickel, a nickel alloy, copper, or a copper alloy, wherein the composition of the $d_{31}$-mode piezoelectric layers has a perovskite phase which is substantially away from a morphotropic phase boundary, and wherein the ceramic composition of the $d_{31}$-mode piezoelectric layers further includes $0.1Pb(N_{1/3}Nb_{2/3})O_3$-$0.35Pb(Zn_{1/3}Nb_{2/3})O_3$-$0.15Pb(Mg_{1/3}Nb_{2/3})O_3$-$0.1PbZrO_3$-$0.3PbTiO_3$ with 4 mol % excess NiO (0.1PNN-0.35PZN-0.15PMN-0.10PZ-0.3PT-0.04NiO).

16. The fluid jet dispenser in accordance with claim 12, wherein the push-up circuitry and the pull-down circuitry each comprises multiple transistors in parallel connection, all the parallelly-connected transistors coupled to the at least two $d_{31}$-mode multilayer piezoelectric actuators at drain terminals of the parallelly-connected transistors.

* * * * *